(12) United States Patent
Masaki et al.

(10) Patent No.: US 12,740,348 B2
(45) Date of Patent: Sep. 15, 2026

(54) SEMICONDUCTOR SUBSTRATE, MANUFACTURING METHOD AND MANUFACTURING APPARATUS FOR SEMICONDUCTOR SUBSTRATE, SEMICONDUCTOR DEVICE, MANUFACTURING METHOD AND MANUFACTURING APPARATUS FOR SEMICONDUCTOR DEVICE, AND ELECTRONIC DEVICE

(71) Applicant: KYOCERA Corporation, Kyoto (JP)

(72) Inventors: Katsuaki Masaki, Kyoto (JP); Takeshi Kamikawa, Kyoto (JP); Toshihiro Kobayashi, Kyoto (JP); Yuichiro Hayashi, Kyoto (JP); Yuki Taniguchi, Kyoto (JP); Yuta Aoki, Kyoto (JP)

(73) Assignee: KYOCERA CORPORATION, Kyoto (JP)

( * ) Notice: Subject to any disclaimer, the term of this patent is extended or adjusted under 35 U.S.C. 154(b) by 366 days.

(21) Appl. No.: 18/555,986

(22) PCT Filed: Apr. 14, 2022

(86) PCT No.: PCT/JP2022/017816

§ 371 (c)(1),
(2) Date: Oct. 18, 2023

(87) PCT Pub. No.: WO2022/224902

PCT Pub. Date: Oct. 27, 2022

(65) Prior Publication Data

US 2024/0203732 A1 Jun. 20, 2024

(30) Foreign Application Priority Data

Apr. 20, 2021 (JP) ................................ 2021-071379

(51) Int. Cl.
*H10P 14/20* (2026.01)
*H10P 14/24* (2026.01)
(Continued)

(52) U.S. Cl.
CPC .......... *H10P 14/3416* (2026.01); *H10P 14/24* (2026.01); *H10P 52/00* (2026.01); *H10W 20/042* (2026.01)

(58) Field of Classification Search
CPC ......... H01L 21/76871; H01L 21/02433; H01L 21/3065; H01L 21/0262; H01L 21/02381;
(Continued)

(56) References Cited

U.S. PATENT DOCUMENTS 8,859,399 B2 * 10/2014 Zang .................... H10H 20/018 257/745
9,735,010 B1 * 8/2017 Caimi ............... H01L 21/02694
(Continued)

FOREIGN PATENT DOCUMENTS

JP 2009-239270 A 10/2009
JP 2014-150211 A 8/2014
(Continued)

*Primary Examiner* — Mouloucoulaye Inoussa
(74) *Attorney, Agent, or Firm* — Volpe Koenig

(57) ABSTRACT

A main substrate, a seed portion (SD) located higher than the main substrate, and first and second semiconductor parts (8F and 8S) arranged side by side in a first direction (9Y direction) are provided. The first and second semiconductor parts are in contact with the seed portion, a longitudinal direction of the seed portion (SD) is the first direction (Y direction), and a hollow portion (VD) is located between the main substrate (1) and each of the first semiconductor part and the second semiconductor part.

20 Claims, 22 Drawing Sheets

(51) Int. Cl.
*H10P 52/00* (2026.01)
*H10W 20/00* (2026.01)

(58) Field of Classification Search
CPC ............. H01L 21/02458; H01L 21/304; H01L 21/0265; H01L 21/02634; H01L 21/02389; H01L 21/0254; H01L 21/02639; H01L 21/02647; H01L 21/02642; H01L 21/0243; C30B 25/02; C30B 29/406; C30B 25/186; C30B 29/403; C30B 25/04; H10D 30/015; H10D 30/475; H10D 64/251; H10D 62/117; H10H 20/01335; H10H 20/815; H10H 20/819; H10H 20/0137; H10H 20/825; H10H 20/018; H01S 5/3211; H01S 5/2018; H01S 5/209; H01S 5/04256; H01S 5/04254; H01S 5/04257; H01S 5/34333; H01S 5/0281; G03B 21/2033
See application file for complete search history.

(56) References Cited

U.S. PATENT DOCUMENTS

2006/0284187 A1* 12/2006 Wierer, Jr. ........... H10H 20/821 257/E33.068
2008/0054292 A1* 3/2008 Guo ........................ C30B 25/02 438/46
2008/0197358 A1* 8/2008 Frahm .................. C30B 23/025 117/106
2011/0006343 A1* 1/2011 Hata .................... H10D 86/011 438/481
2012/0119220 A1* 5/2012 Guo ...................... C30B 29/403 257/E29.089
2012/0217537 A1* 8/2012 Jin .................... H01L 21/02381 438/46
2012/0280243 A1* 11/2012 Lee .................. H01L 21/02603 257/E21.09
2013/0228809 A1* 9/2013 Chang .................. H10H 20/018 257/E29.022
2014/0167066 A1* 6/2014 Kashima ................ H10H 20/84 257/98
2015/0255375 A1* 9/2015 Knight ............. H01L 23/53295 438/619
2016/0111330 A1* 4/2016 Fenouillet-Beranger .................... H01L 21/3065 438/637
2017/0104135 A1* 4/2017 Shur ...................... H10D 86/40
2017/0117438 A1* 4/2017 Shur ........................ G06F 30/30
2018/0219087 A1* 8/2018 Dasgupta ............. H10D 30/015
2018/0237324 A1* 8/2018 Covert .................. C03B 9/1934
2019/0228965 A1* 7/2019 Caimi ............... H01L 21/02455
2019/0393012 A1* 12/2019 Ok ........................ H01J 21/105
2020/0041889 A1* 2/2020 Ishizawa ................. H01S 5/423
2020/0044418 A1* 2/2020 Nishioka ............. H01S 5/18344
2020/0224331 A1* 7/2020 D'Evelyn ........ H10H 20/01335
2020/0266611 A1* 8/2020 Nagawa ................ H01S 5/3211
2020/0274330 A1* 8/2020 Nagawa ................ H01S 5/2031
2021/0246571 A1* 8/2021 Cardwell ................ C30B 25/18
2021/0249252 A1* 8/2021 Jiang ................... H01L 21/0243
2021/0249266 A1* 8/2021 D'Evelyn ......... H01L 21/02389
2021/0408765 A1* 12/2021 Ishizawa ............ G03B 21/2033
2022/0216368 A1* 7/2022 Hwang ................. C30B 25/186
2022/0320276 A1* 10/2022 Lin ...................... H10D 62/121
2023/0140914 A1* 5/2023 Masaki ................... H01L 21/02 257/99
2024/0302302 A1* 9/2024 Yoshida .................. C30B 25/18

FOREIGN PATENT DOCUMENTS

JP 2017-535051 A 11/2017
JP 2018-032863 A 3/2018
KR 2019-0042947 A 4/2019

* cited by examiner

SEMICONDUCTOR SUBSTRATE, MANUFACTURING METHOD AND MANUFACTURING APPARATUS FOR SEMICONDUCTOR SUBSTRATE, SEMICONDUCTOR DEVICE, MANUFACTURING METHOD AND MANUFACTURING APPARATUS FOR SEMICONDUCTOR DEVICE, AND ELECTRONIC DEVICE

TECHNICAL FIELD

The present invention relates to a semiconductor substrate and the like.

BACKGROUND OF INVENTION

Patent Document 1 discloses a method for forming a semiconductor device layer (including an active layer) in a floating state, above a main substrate such as a silicon substrate, using an epitaxial lateral overgrowth (ELO) method.

CITATION LIST

Patent Literature

Patent Document 1: JP 2018-32863 A

SUMMARY

A semiconductor substrate according to the present disclosure includes a main substrate, a seed portion located higher than the main substrate, and first and second semiconductor parts arranged side by side in a first direction. The first and second semiconductor parts are in contact with the seed portion, a longitudinal direction of the seed portion is the first direction, and a hollow portion is located between the main substrate and each of the first semiconductor part and the second semiconductor part.

DESCRIPTION OF EMBODIMENTS

Semiconductor Substrate

Figure 1:
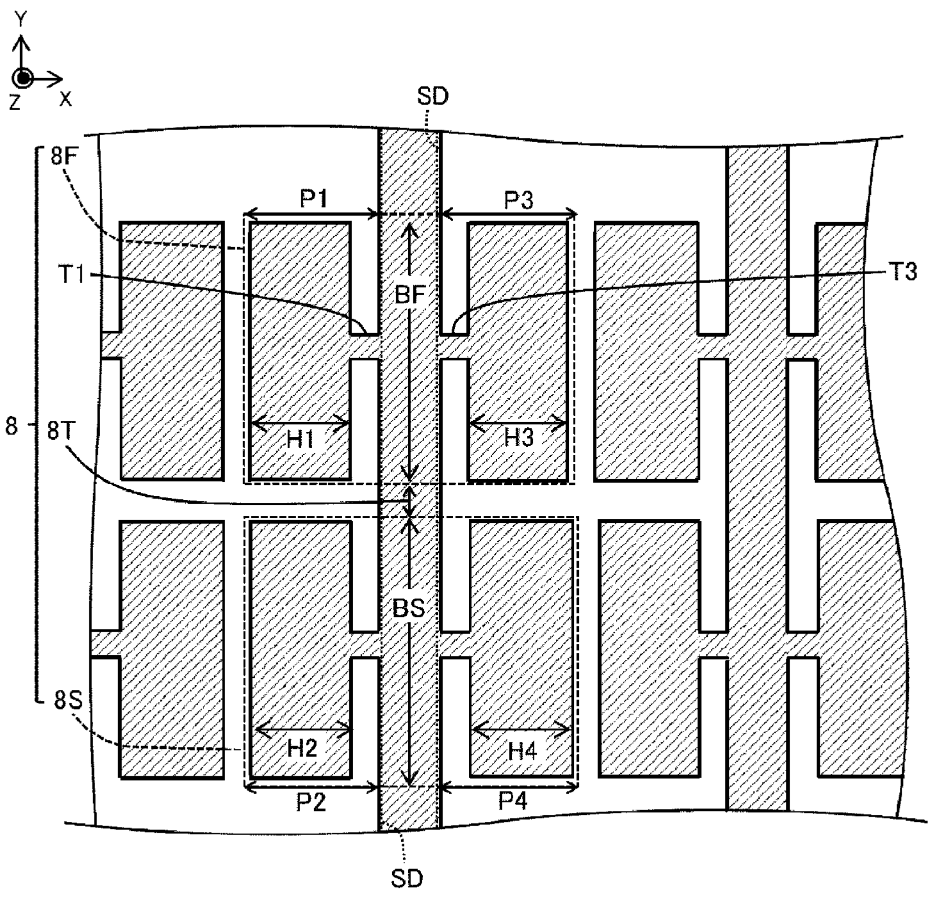
FIG. 1 is a plan view illustrating a configuration of a semiconductor substrate according to the present embodiment.
Figure 2A:
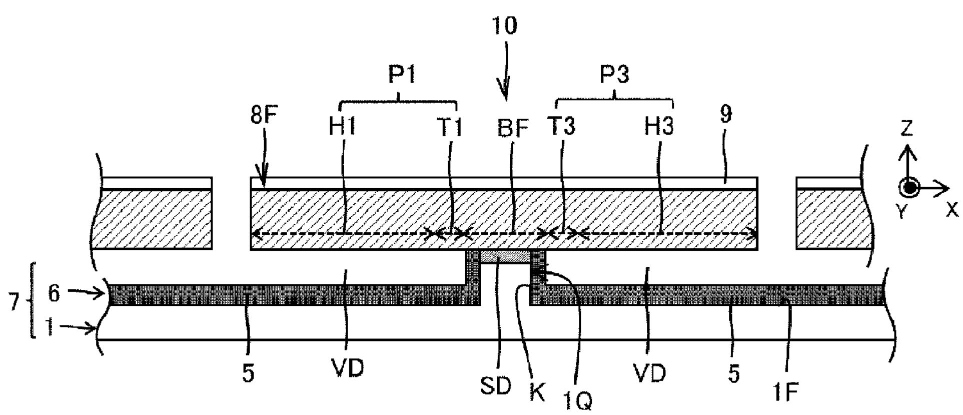
FIG. 2A is a cross-sectional view illustrating the configuration of the semiconductor substrate according to the present embodiment.
Figure 2B:
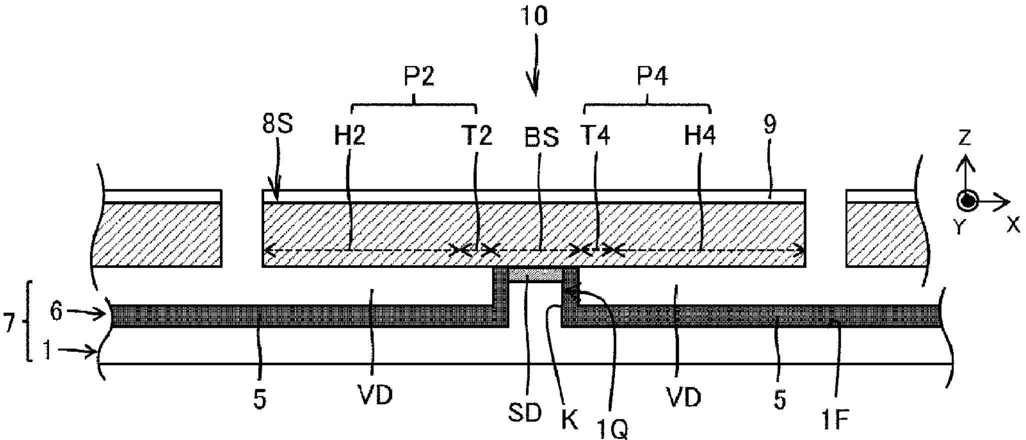
FIG. 2B is a cross-sectional view illustrating the configuration of the semiconductor substrate according to the present embodiment.

FIG. 1 is a plan view illustrating a configuration of first and second semiconductor parts of a semiconductor substrate according to the present embodiment. FIGS. 2A and 2B are cross-sectional views each illustrating a configuration of the semiconductor substrate according to the present embodiment. As illustrated in FIGS. 1, 2A and 2B, a semiconductor substrate 10 (semiconductor wafer) according to the present embodiment includes a main substrate 1, a seed portion SD located higher than the main substrate 1, and a first semiconductor part 8F and a second semiconductor part 8S arranged side by side in a first direction (Y direction), and the first semiconductor part 8F and the second semiconductor part 8S are in contact with the seed portion SD. The seed portion SD has the Y direction as the longitudinal direction. A hollow portion (void portion) VD is located between the main substrate 1 and each of the first semiconductor part 8F and the second semiconductor part 8S. Note that, in the present disclosure, the first semiconductor part 8F and the second semiconductor part 8S may be a first semiconductor layer 8F and a second semiconductor layer 8S, each of which is formed as a layer.

On an upper surface If of the main substrate, a protruding portion 1Q protruding upward is provided, and the seed portion SD is located on the protruding portion 1Q. A mask pattern 6 including an opening portion K and a mask portion 5 is provided above the main substrate 1. In a plan view, the opening portion K and the seed portion SD overlap each other, and the hollow portion VD is located between the mask portion 5 and each of the first and second semiconductor parts 8F and 8S.

The first semiconductor part 8F includes a first floating portion PI facing the main substrate 1 via the hollow portion VD, the second semiconductor part 8S includes a second floating portion P2 facing the main substrate 1 via the hollow portion VD, and the first floating portion P1 and the second floating portion P2 are separated from each other. The first semiconductor part 8F includes a third floating portion P3 paired with the first floating portion P1, and the first floating portion P1 and the third floating portion P3 are arranged side by side in a second direction (X direction) orthogonal to the first direction (Y direction) in a floating state (a state in which no support member is provided on the bottom side of the floating portions and the floating portions are exposed to the hollow portion). The second semiconductor part 8S includes a fourth floating portion P4 paired with the second floating portion P2, and the second floating portion P2 and the fourth floating portion P4 are arranged side by side in the X direction in a floating state.

The first semiconductor part 8F includes a first base portion BF located on the seed portion SD, and the first base portion BF is located between the first and third floating portions P1 and P3 and connected to the first and third floating portions P1 and P3. The second semiconductor part 8S includes a second base portion BS located on the seed portion SD, and the second base portion BS is located between the second and fourth floating portions P2 and P4 and connected to the second and fourth floating portions P2 and P4.

The first floating portion P1 includes a tether portion T1 connected to the first base portion BF and a body portion H1 connected to the tether portion T1, and the tether portion T1 has a shorter length in the Y direction than the body portion H1. The third floating portion P3 includes a tether portion T3 connected to the first base portion BF and a body portion H3 connected to the tether portion T3, and the tether portion T3 has a shorter length in the Y direction than the body portion H3. Note that the configuration of the tether portion T1 is not limited to this example. The tether portion T1 may have the same length in the Y direction as the body portion H1 and a smaller thickness (size in a Z direction) than the body portion H1. The tether portion T1 may have a shorter length in the Y direction than the body portion H1 and a smaller thickness than the body portion H1.

The semiconductor substrate 10 includes a third electrical conductor part 8T located on the seed portion SD, and the first base portion BF and the second base portion BS are connected to each other via the third semiconductor part 8T. Note that, in the present disclosure, the third electrical conductor part 8T is formed as a layer, and hereinafter may be referred to as a third electrical conductor layer 8T.

In the semiconductor substrate 10, a plurality of members, each of which is as a layer, are layered on the main substrate 1, and a layering direction thereof can be defined as an "upward direction". Also, viewing the semiconductor substrate 10 with a line of sight parallel to a normal direction of the semiconductor substrate 10 can be referred to as a "plan view". The semiconductor substrate refers to a substrate including a semiconductor part, and the main substrate 1 may be a semiconductor or a non-semiconductor. The main substrate 1, the mask pattern 6, and a first seed portion SI as a layer may be collectively referred to as a template substrate 7.

The first and second semiconductor parts 8F and 8S each contain a nitride semiconductor. The nitride semiconductor may be expressed, for example, by AlxGayInzN (0≤x≤1; 0≤y≤1; 0≤z≤1; x+y+z=1). Specific examples of the nitride semiconductor may include a GaN-based semiconductor, aluminum nitride (AlN), indium aluminum nitride (InAlN), and indium nitride (InN). A GaN-based semiconductor is a semiconductor containing gallium atoms (Ga) and nitrogen atoms (N), and examples thereof may include GaN, AlGaN, AlGaInN, and InGaN. The first and second semiconductor parts 8F and 8S may each be of a doped type (for example, an n-type including a donor) or a non-doped type.

The first and second semiconductor parts 8F and 8S can be formed using an epitaxial lateral overgrowth (ELO) method. In the ELO method, for example, in FIGS. 2A and 2B, while using a heterogeneous substrate having a different lattice constant from that of a GaN-based semiconductor as the main substrate 1, using a nitride semiconductor as the seed portion SD, and using an inorganic compound film as the mask portion 5, the first semiconductor part 8F including a GaN-based semiconductor can be laterally (in the X direction) grown above (in midair above) the mask portion 5 from the first base portion BF. In this case, the thickness direction (Z direction) of the first semiconductor part 8F can be defined as a <0001>direction (c-axis direction) of a GaN-based crystal, the longitudinal direction (first direction, Y direction) of the seed portion SD and the opening portion K, each having a longitudinal shape, can be defined as a <1-100>direction (m-axis direction) of the GaN-based crystal, and the width direction (second direction, X direction) of the seed portion SD and the opening portion K can be defined as an <11-20>direction (a-axis direction) of the GaN-based crystal. A layer (including the first and second semiconductor parts 8F and 8S) formed by the ELO method may be referred to as an ELO semiconductor part 8.

The first semiconductor part 8F formed by the ELO method includes a low dislocation portion (first floating portion P1) overlapping the mask portion 5 in a plan view and having relatively a few threading dislocations, and the first base portion BF overlapping the seed portion SD at the opening portion K in a plan view and having relatively more threading dislocations than the low dislocation portion. The low dislocation portion may have a non-threading dislocation density higher than a threading dislocation density.

When an active section as a layer (hereinafter also simply referred to as an active layer) is included above the first semiconductor part 8F, a light-emitting region of the active layer can be provided overlapping the low dislocation portion in a plan view, for example.

The threading dislocation is a dislocation (defect) extending from the lower surface or inside to the surface or surface layer of the first semiconductor part 8F along the thickness direction (Z direction) of the first semiconductor part 8F. Cathode luminescence (CL) measurement on the surface layer (parallel to the c-plane) of the first semiconductor part 8F allows observation of the threading dislocation. The non-threading dislocation is a dislocation that is subjected to CL measurement in a cross section taken along a plane parallel to the thickness direction (m-plane, for example), and is mainly a basal plane (c-plane) dislocation.

A functional portion 9 as a layer is provided on at least the first and second semiconductor parts 8F and 8S. The functional layer 9 (hereinafter also simply referred to as a functional layer) may be a single layer or a laminate. The functional layer 9 may have at least one selected from the group consisting of a function as a constituent element of a semiconductor device, a function of protection from external force, a function of protection from static electricity, a protection function of suppressing entry of a foreign matter such as water and oxygen, a function of protection from an etchant or the like, an optical function, and a sensing function. The functional layer 9 may also be formed on side surfaces (end surfaces) of the first and second semiconductor parts 8F and 8S.

In the semiconductor substrate 10 illustrated in FIGS. 1, 2A and 2B, the first floating portion P1, exposed to the hollow portion VD (but not in contact with the seed portion SD), of the first semiconductor part 8F is separated from the second floating portion P2, exposed to the hollow portion VD (but not in contact with the seed portion SD), of the second semiconductor part 8S. Thus, a separating step, which is performed when a semiconductor device including the body portions H1 and H3 is obtained from the semiconductor substrate 10, is easy. For example, the body portion H1 of the first floating portion P1 may be separated from the semiconductor substrate 10 by breaking the tether portion T1. Since the body portion H1 is floating from the main substrate 1, stress from the main substrate 1 is alleviated, and cracks and defects that occur in the body portion H1 are reduced. By floating the body portion H1 from the main substrate 1 and disposing the mask portion 5 functioning as a selective growth mask (deposition suppression mask) below the body portion H1, the body portion H1 becomes the low dislocation portion, and an active region (light-emitting region, for example) can be formed overlapping the low dislocation portion in a plan view. The threading dislocation density of the low dislocation portion may be, for example, $5\times10^6$ [pieces/cm$^2$] or less, and the size of the body portion H1 in the X direction may be 10 μm or greater. The body portion H1, the tether portion T1, and the like can be formed by a simple step such as etching after the formation of the ELO semiconductor part.

Manufacturing Semiconductor Substrate

Figure 3:
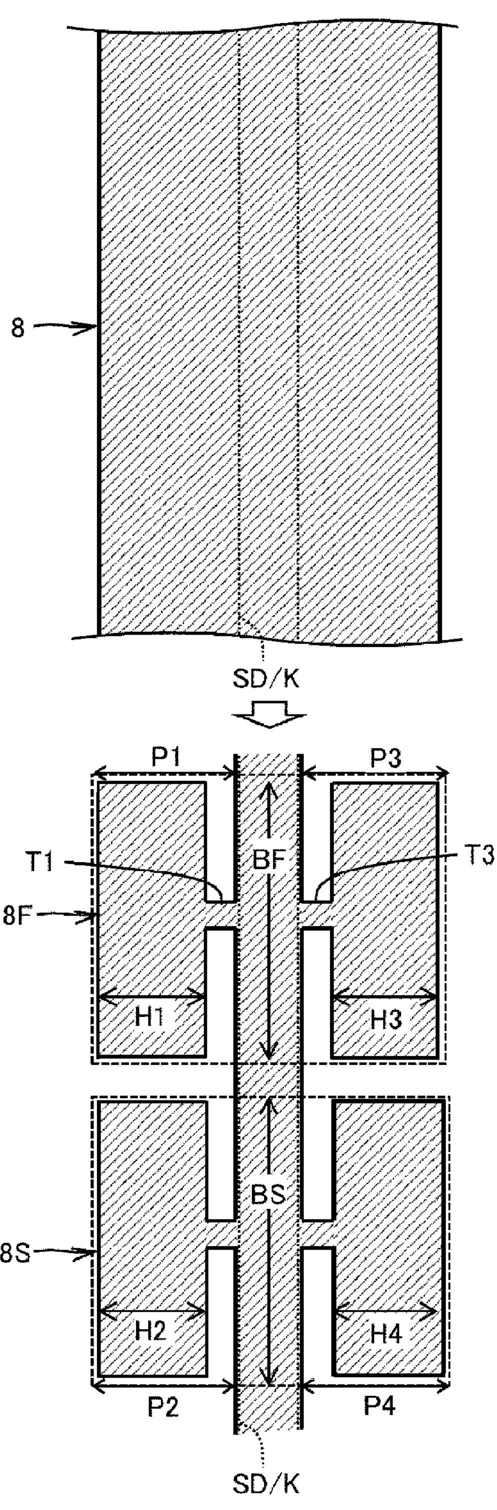
FIG. 3 is a plan view illustrating an example of a manufacturing method for manufacturing the semiconductor substrate according to the present embodiment.
Figure 4:
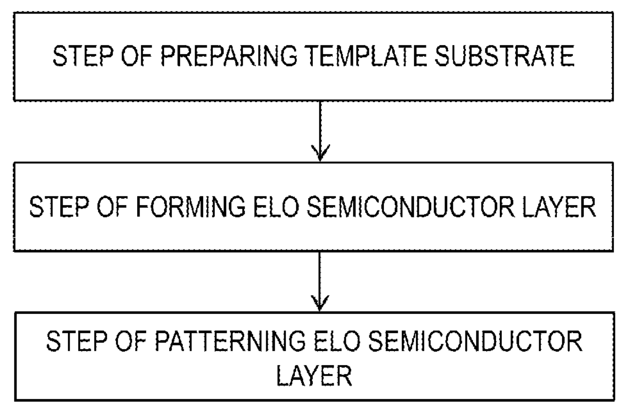
FIG. 4 is a flowchart showing the example of the manufacturing method for manufacturing the semiconductor substrate according to the present embodiment.

FIG. 3 is a plan view illustrating an example of a manufacturing method for manufacturing the semiconductor substrate according to the present embodiment. FIG. 4 is a flowchart showing an example of the manufacturing method for manufacturing the semiconductor substrate according to the present embodiment. In the manufacturing method for manufacturing the semiconductor substrate illustrated in FIGS. 3 and 4, after a step of preparing the template substrate 7, the ELO semiconductor part (air bridge structure) 8 not in contact with the mask pattern 6 is formed over the template substrate 7, and then, a step of forming the first and second semiconductor parts 8F and 8S is performed by patterning (etching, for example) the ELO semiconductor part 8 using a photolithography method. By this step, the first floating portion P1 including the body portion H1 and the tether portion T1, and the second floating portion P2 separated from the first floating portion P1 can be formed. Note that before or after the step of patterning the ELO semiconductor part 8, a step of forming the functional layer 9 can be performed.

Figure 5:
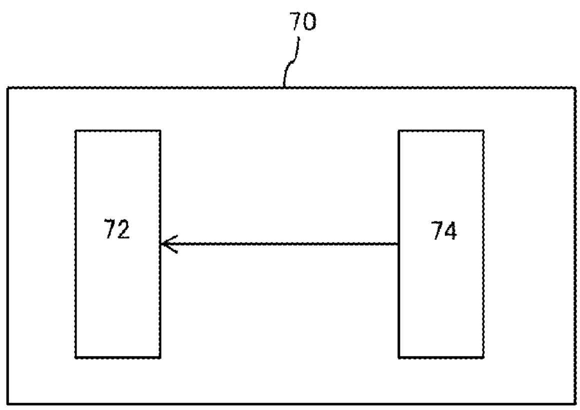
FIG. 5 is a block diagram illustrating an example of a manufacturing apparatus for manufacturing the semiconductor substrate according to the present embodiment.

FIG. 5 is a block diagram illustrating an example of a manufacturing apparatus for manufacturing the semiconductor substrate according to the present embodiment. A manufacturing apparatus 70 for manufacturing the semiconductor substrate in FIG. 5 includes a semiconductor part former 72 that performs a step of forming the first and second semiconductor parts 8F and 8S over the template substrate 7, and a controller 74 that controls the semiconductor part former 72. The semiconductor part former 72 forms the ELO semiconductor part 8 not in contact with the mask pattern 6, and then, performs the step of forming the first and second semiconductor parts 8F and 8S by patterning the ELO semiconductor part 8 using, for example, the photolithography method. The manufacturing apparatus 70 for manufacturing the semiconductor substrate may be configured to form the functional layer 9.

The semiconductor part former 72 may include an MOCVD device and a patterning device, and the controller 74 may include a processor and a memory. The controller 74 may be configured to control the semiconductor part former 72 by executing a program stored in a built-in memory, a communicable communication device, or an accessible network, for example, and the present embodiment also includes the program, and a recording medium storing the program therein.

Manufacturing Semiconductor Device

Figure 6:
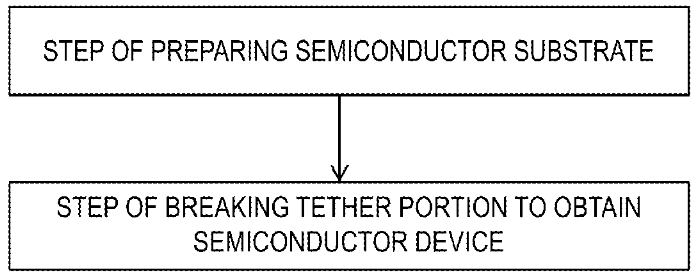
FIG. 6 is a flowchart showing an example of a manufacturing method for manufacturing a semiconductor device according to the present embodiment.

FIG. 6 is a flowchart showing an example of a manufacturing method for manufacturing a semiconductor device according to the present embodiment. In the manufacturing method for the semiconductor device illustrated in FIG. 6, after the step of preparing the semiconductor substrate 10, a step of obtaining the semiconductor device by breaking the tether portion T1 and the like to separate the body portion H1 and the like from the semiconductor substrate 10 is performed.

Figure 7:
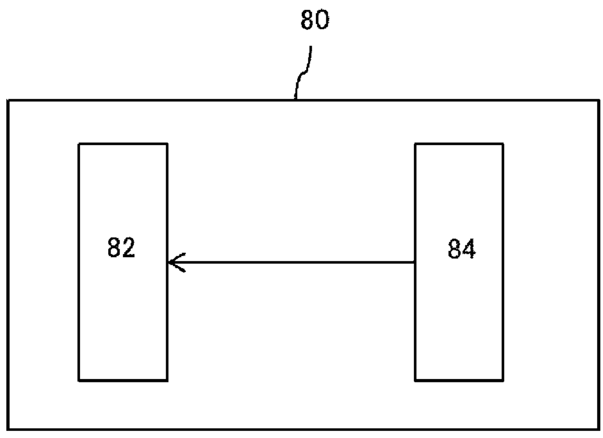
FIG. 7 is a block diagram illustrating an example of a manufacturing apparatus for manufacturing the semiconductor device according to the present embodiment.

FIG. 7 is a block diagram illustrating an example of a manufacturing apparatus for manufacturing the semiconductor device according to the present embodiment. A manufacturing apparatus 80 for manufacturing the semiconductor device in FIG. 7 includes a semiconductor device generator 82 and a controller 84 that controls the semiconductor device generator 82. The semiconductor device generator 82 performs a step of obtaining the semiconductor device by breaking the tether portion T1 to separate a body portion HT from the semiconductor substrate 10 and obtain the semiconductor device. The manufacturing apparatus 80 for manufacturing the semiconductor device may be configured to form the functional layer 9.

Semiconductor Device

The body portion H1 separated from the semiconductor substrate 10 can function as the semiconductor device. Specific examples of the semiconductor device include a light-emitting diode (LED), a semiconductor laser, a Schottky diode, a photodiode, and transistors (including a power transistor and a high electron mobility transistor).

Electronic Device

Figure 8:
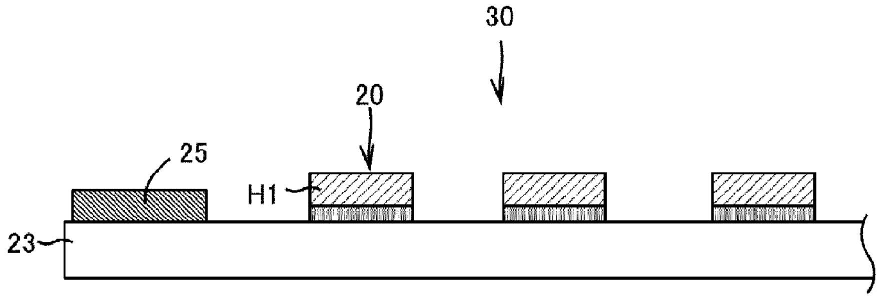
FIG. 8 is a schematic view illustrating a configuration of an electronic device according to the present embodiment.

FIG. 8 is a schematic view illustrating a configuration of an electronic device according to the present embodiment. An electronic device 30 in FIG. 8 includes a semiconductor device 20 including the body portion H1, a drive substrate 23 over which the semiconductor device 20 is mounted, and a control circuit 25 that controls the drive substrate 23.

Examples of the electronic device 30 include display devices, laser emitting devices (including a Fabry-Perot type and a surface emitting type), lighting devices, communication devices, information processing devices, sensing devices, and electrical power control devices.

EXAMPLE 1

Overall Configuration

Figure 9:
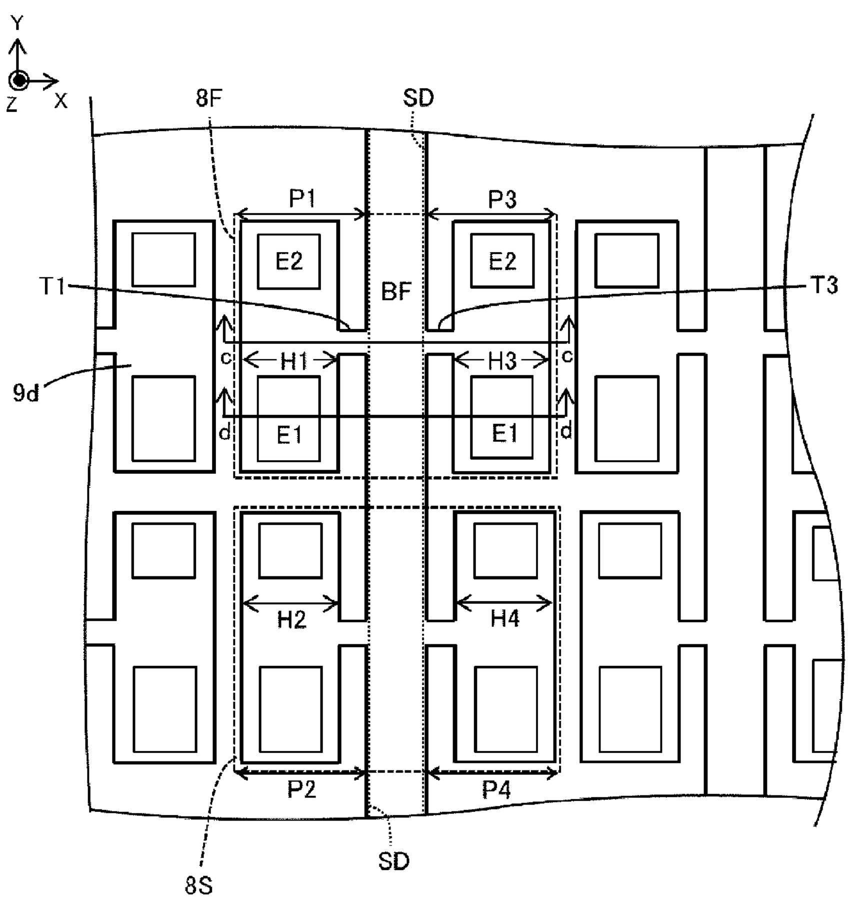
FIG. 9 is a plan view illustrating a configuration of a semiconductor substrate according to Example 1.
Figure 10:
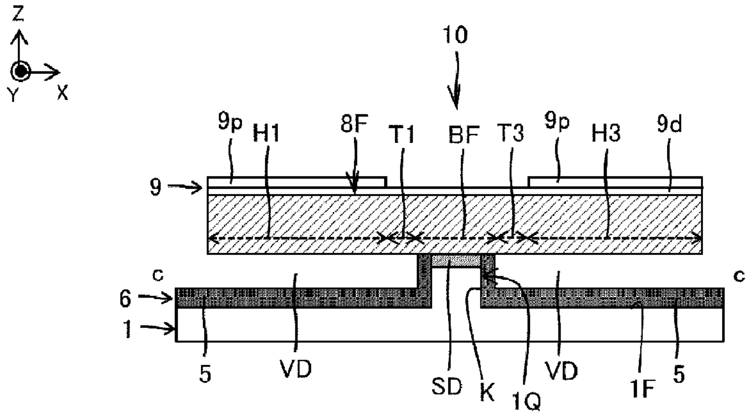
FIG. 10 is a cross-sectional view taken along an arrow c-c in FIG. 9.
Figure 11:
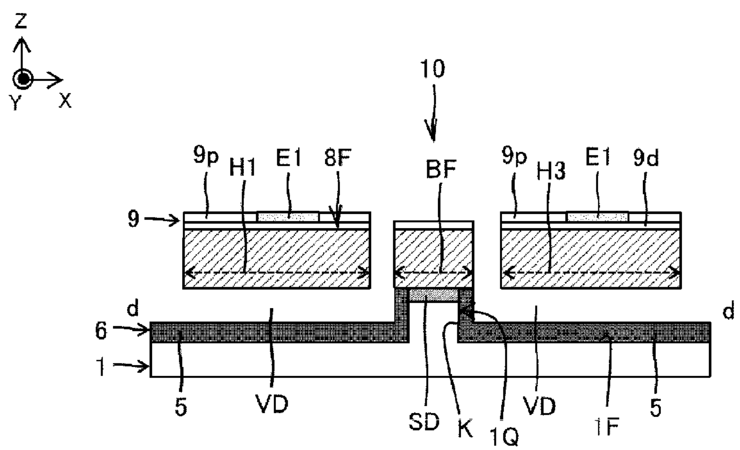
FIG. 11 is a cross-sectional view taken along an arrow d-d in FIG. 9.

FIG. 9 is a plan view illustrating a configuration of a semiconductor substrate according to Example 1. FIG. 10 is a cross-sectional view taken along an arrow c-c in FIG. 9. FIG. 11 is a cross-sectional view taken along an arrow d-d in FIG. 9. As illustrated in FIGS. 9 to 11, the semiconductor substrate 10 according to Example 1 includes the main substrate 1, the seed portion SD located higher than the main substrate 1, and the first semiconductor part 8F and the second semiconductor part 8S arranged side by side in the Y direction. The first semiconductor part 8F and the second semiconductor part 8S are in contact with the seed portion SD, and the hollow portion (void portion) VD is located between the main substrate 1 and each of the first semiconductor part 8F and the second semiconductor part 8S.

The first semiconductor part 8F includes the first floating portion P1 exposed to the hollow portion VD, the second semiconductor part 8S includes the second floating portion P2 exposed to the hollow portion VD, and the first floating portion P1 and the second floating portion P2 are separated from each other. The first semiconductor part 8F includes the third floating portion P3 paired with the first floating portion P1, and the first floating portion P1 and the third floating portion P3 are arranged side by side in the X direction in a floating state. The first semiconductor part 8F includes the first base portion BF located on the seed portion SD, and the first base portion BF is located between the first and third floating portions P1 and P3 and connected to the first and third floating portions P1 and P3.

In Example 1, the length of the first floating portion P1 in the X direction is greater than the thickness of the first floating portion P1. The protruding portion 1Q protruding upward is provided on the upper surface 1F of the main substrate, the seed portion SD is located on the protruding portion 1Q, and the length of the first floating portion P1 in the X direction is greater than the height of the protruding portion 1Q. The first floating portion P1 includes the tether portion T1 connected to the first base portion BF and the body portion H1 connected to the tether portion T1, and the tether portion T1 has a shorter length in the Y direction than the body portion H1.

The semiconductor substrate 10 includes the functional layer 9 overlapping the first floating portion P1 in a plan view. The functional layer 9 overlaps the body portion H1 and the tether portion T1 in a plan view. The length of the tether portion T1 in the Y direction is greater than the thickness of the tether portion T1. The length of the tether portion T1 in the Y direction is equal to or less than half the length of the body portion H1 in the Y direction.

The configuration is not limited to a configuration in which the functional layer 9 overlaps the body portion H1 and the tether portion T1 in a plan view. A configuration in which the functional layer 9 does not overlap the tether portion T1 in a plan view, that is, a configuration in which the functional layer 9 is layered on the body portion H1 and is not layered on the tether portion T1 may be employed. In this way, the tether portion T1 can be easily broken during the separating.

The semiconductor substrate 10 includes the mask pattern 6 including the opening portion K and the mask portion 5 (selective growth mask) above the main substrate 1, and the opening portion K and the seed portion SD overlap each other in a plan view. The hollow portion VD is located between the first semiconductor part 8F and the mask portion 5. The mask portion 5 covers the end surfaces of the seed portion SD. That is, the upper surface of the seed portion SD is in contact with the first base portion BF, the lower surface of the seed portion SD is in contact with the upper surface (protruding portion 1Q) of the main substrate 1, and the end surfaces (side surfaces) of the seed portion SD are covered with the mask portion 5. Thus, the semiconductor part 8F is not in contact with the end surface of the seed portion SD.

Figure 12:
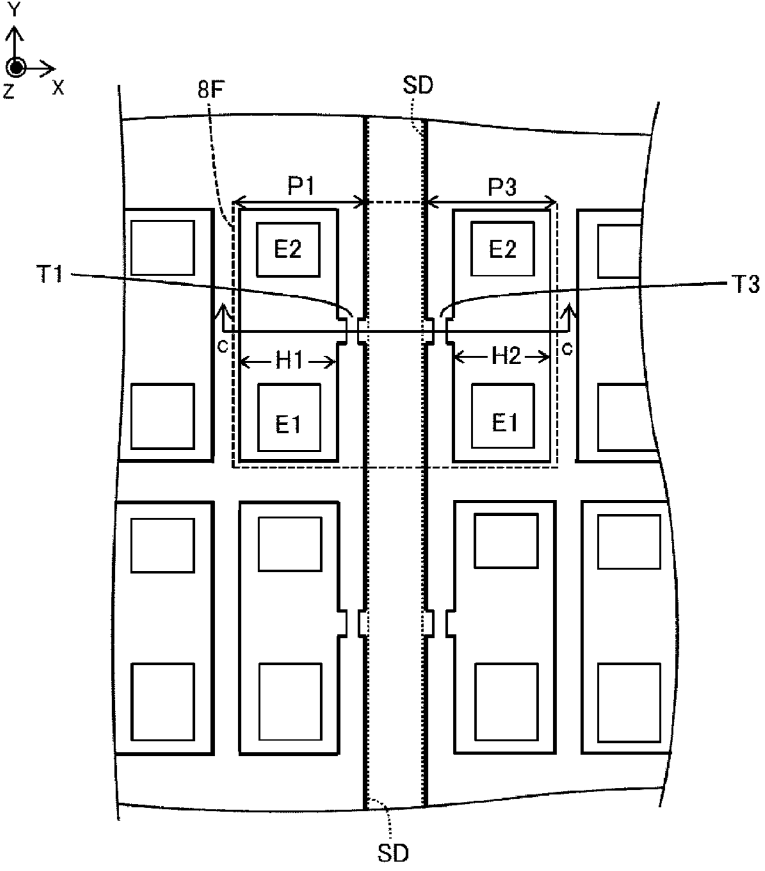
FIG. 12 is a plan view illustrating a step of separating semiconductor devices according to Example 1.
Figure 13:
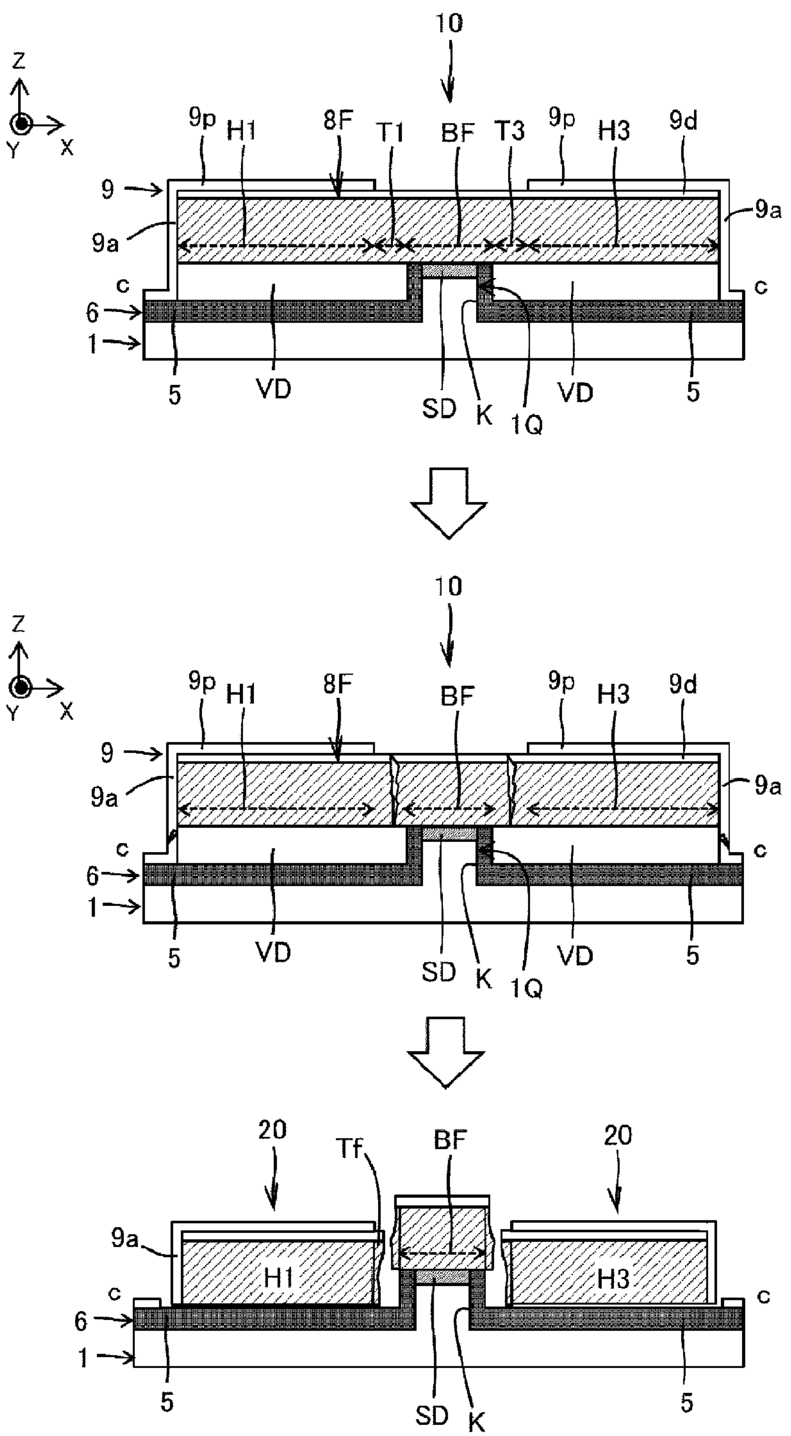
FIG. 13 is a cross-sectional view illustrating the step of separating the semiconductor devices according to Example 1.

FIG. 12 is a plan view illustrating a step of separating semiconductor devices according to Example 1. FIG. 13 is a cross-sectional view illustrating the step of separating the semiconductor devices according to Example 1. As illustrated in FIGS. 12 and 13, for example, by breaking the tether portions T1 and T3, the body portion HI of the first floating portion P1 and the body portion H3 of the third floating portion P3 are separated from the semiconductor substrate 10, and the semiconductor devices 20 can be obtained. A portion Tf of the tether portion T1 may remain on one side surface of the semiconductor device 20, and an anchor film 9*a* (described later) may remain on the other side surface of the semiconductor device 20.

As for a method for breaking the tether portions T1 and T3, the functional layer 9 may be applied with a (downward) pressure from above (may be pressed), or the tether portions T1 and T3 may be broken by a laser. Alternatively, the tether portions T1 and T3 may be broken by temperature control of the semiconductor substrate 10. For example, a Peltier element may be used to lower the temperature of the semiconductor substrate 10 to which an adhesive tape is attached. At this time, the adhesive tape, generally having a greater thermal expansion coefficient than a semiconductor, contracts considerably, and stress is applied to the tether portions T1 and T3. As another method, a support substrate may be bonded onto the semiconductor substrate 10, and an upward force may be mechanically applied to the tether portions T1 and T3 to break them.

Main Substrate

A heterogeneous substrate having a different lattice constant from that of a GaN-based semiconductor may be used for the main substrate 1. Examples of the heterogeneous substrate include a single-crystal silicon (Si) substrate, a sapphire ($Al_2O_3$) substrate, and a silicon carbide (SiC) substrate. The plane orientation of the main substrate 1 is, for example, the (111) plane of the silicon substrate, the (0001) plane of the sapphire substrate, or the 6H-SiC (0001) plane of the SiC substrate. These are merely examples, and any main substrate and any plane orientation may be used as long as the ELO semiconductor part can be grown.

Seed Portion

The seed portion SD is a growth starting point of the ELO semiconductor part, and a nitride semiconductor (GaN-based semiconductor, AlN, InAlN, InN, or the like), silicon carbide (SiC), or the like can be used as the seed portion SD. Aluminum nitride (AlN) locally formed on the protruding portion of the main substrate 1, which is, for example, a silicon substrate or a silicon carbide substrate, can be used as the seed portion SD. Alternatively, a GaN-based semiconductor locally formed on the protruding portion of the main substrate 1, which is a silicon carbide substrate, can be used as the seed portion SD.

Figure 14A:
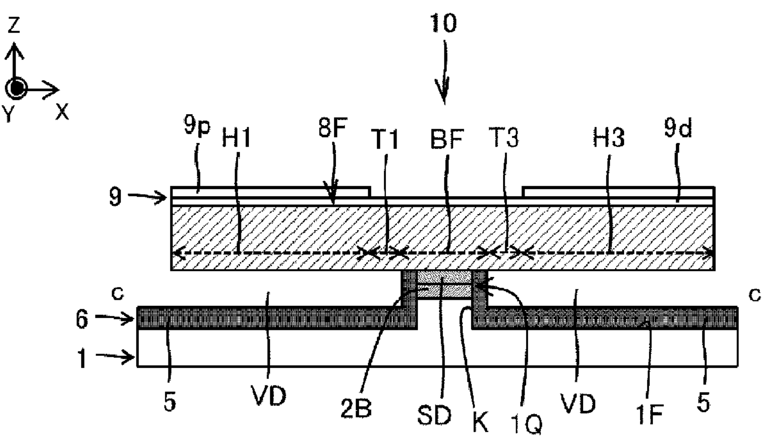
FIG. 14A is a cross-sectional view illustrating another configuration of the semiconductor substrate according to Example 1.
Figure 14B:
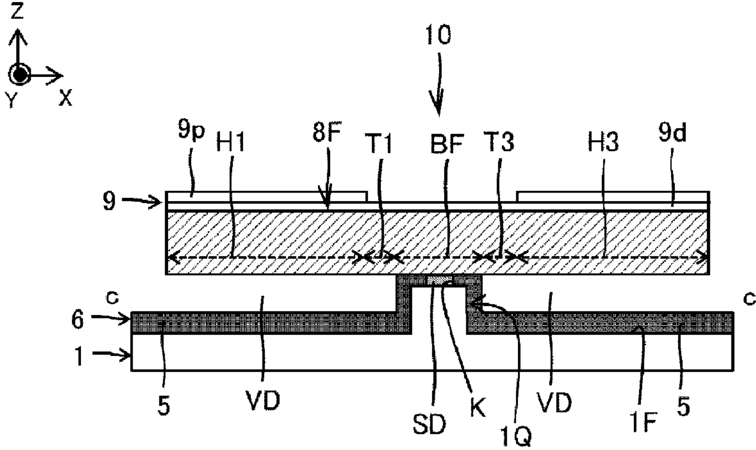
FIG. 14B is a cross-sectional view illustrating another configuration of the semiconductor substrate according to Example 1.

FIG. 14A is a cross-sectional view illustrating another configuration of the semiconductor substrate according to Example 1. As illustrated in FIG. 14A, the seed portion SD, which is a GaN-based semiconductor, may be locally formed over the protruding portion of the main substrate 1, which is a silicon substrate, with a buffer portion 2B (AlN, for example) interposed therebetween. When the silicon substrate is used as the main substrate 1 and the GaN-based semiconductor is used as the seed portion SD, they (the silicon substrate and the GaN-based semiconductor) may melt into each other, but the melting can be suppressed by providing the buffer portion 2B such as AlN. By providing the buffer portion 2B having a lattice constant close to that of a GaN-based semiconductor, improvement in the crystallinity of the seed portion SD can also be expected. As the buffer portion 2B, AlN formed at a low temperature (800° C. or lower) may be used. In this way, the crystallinity of the seed portion SD (GaN-based semiconductor, for example) is improved. The seed portion SD and the buffer portion 2B may be formed by a method other than the MOCVD method, for example, by a sputtering method or the like. In that case, the cost of consumables can be reduced, the depreciation cost can be reduced, and the productivity can be enhanced. FIG. 14B is a cross-sectional view illustrating another configuration of the semiconductor substrate according to Example 1. As illustrated in FIG. 14B, the seed portion SD may be provided on a portion of the upper surface of the protruding portion 1Q.

Mask Pattern

Figure 15:
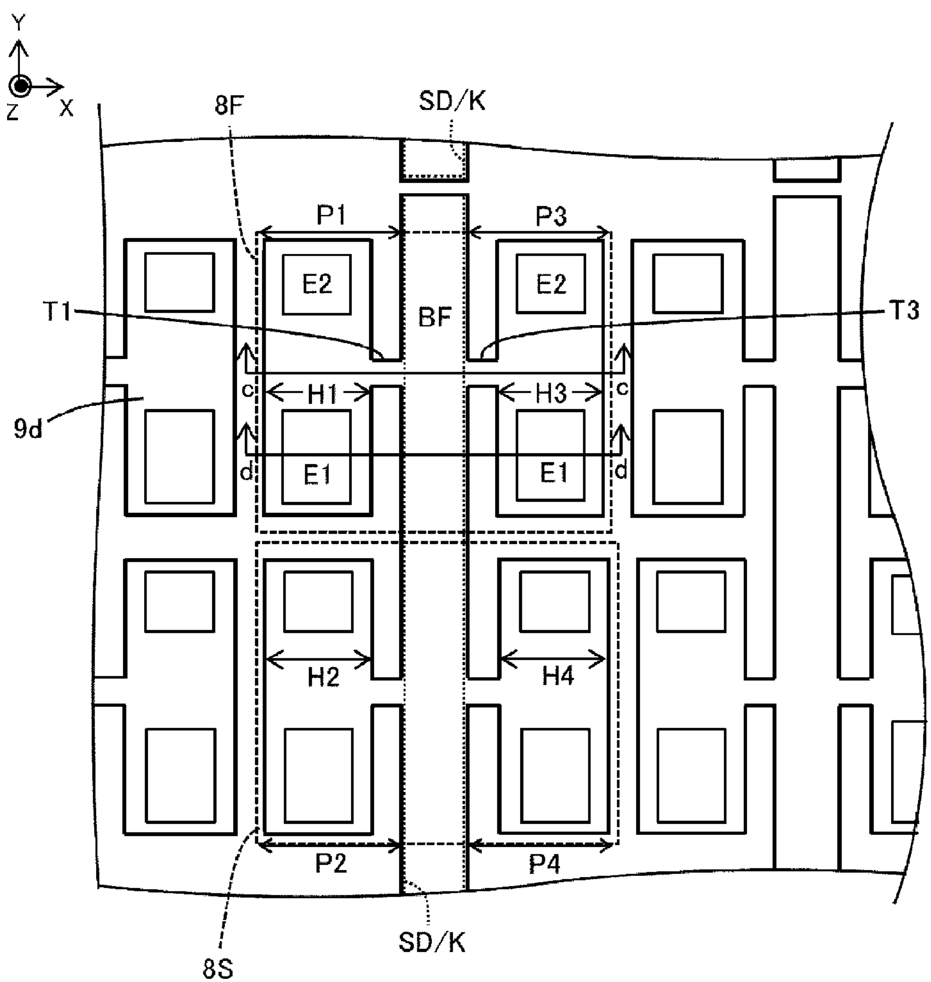
FIG. 15 is a plan view illustrating another configuration of the semiconductor substrate according to Example 1.

The mask pattern 6 includes the mask portion 5 and the opening portion K, and the seed portion SD is exposed at the opening portion K. A configuration may be employed in which the opening portions K are a plurality of slits each extending in the Y direction and the mask portion 5 is located between the adjacent opening portions K. FIG. 15 is a plan view illustrating another configuration of the semiconductor substrate according to Example 1. As illustrated in FIG. 15, the opening portion K and the seed portion SD may be partitioned in the Y direction. That is, a plurality of the seed portions SD having the Y direction as the longitudinal direction thereof are arranged side by side in the Y direction. In this way, a plurality of the ELO semiconductor parts arranged side by side in the Y direction are formed, and stress generated between the main substrate 1 and mainly the first semiconductor part 8F can be alleviated. Accordingly, occurrence of defects and cracks at the first semiconductor part 8F is reduced. In addition, warping of the main substrate 1 is reduced, and the diameter of the main substrate 1 can be easily increased. The mask portion 5 and the opening portion K refer to a portion with a mask body and a portion without the mask body, respectively, regardless of whether the mask portion 5 is formed as a layer. The mask pattern 6 may be a mask layer. The opening portion K need not necessarily be entirely surrounded by the mask portion 5.

Examples of the mask portion 5 that can be used include a single-layer film including any one of a silicon oxide film (SiOx), a titanium nitride film (TiN or the like), a silicon nitride film (SiNx), a silicon oxynitride film (SiON), and a metal film having a high melting point (for example, 1000° C. or higher), or a layered film including at least two thereof. A silicon oxide film may be decomposed and evaporated in a small amount during film formation of the ELO semiconductor part and may be taken into the ELO semiconductor part, but a silicon nitride film and a silicon oxynitride film have an advantage in that they are hardly decomposed and evaporated at a high temperature. Thus, the mask portion 5 may be a single-layer film of a silicon nitride film or a silicon oxynitride film, a layered film in which a silicon oxide film and a silicon nitride film are formed in this order, a laminate film in which a silicon nitride film and a silicon oxide film are formed in this order, or a layered film in which a silicon nitride film, a silicon oxide film, and a silicon nitride film are formed in this order.

Template Substrate

Figure 16:
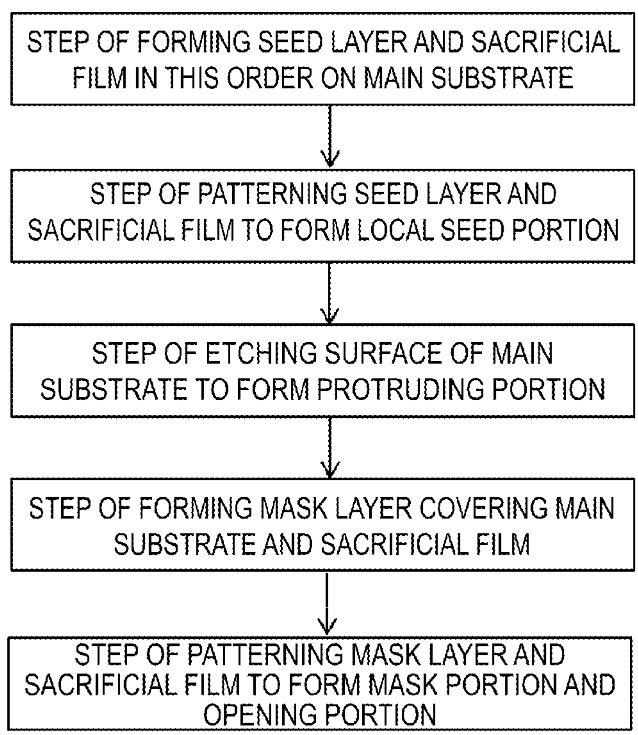
FIG. 16 is a flowchart showing a manufacturing method for manufacturing a template substrate according to Example 1.
Figure 17:
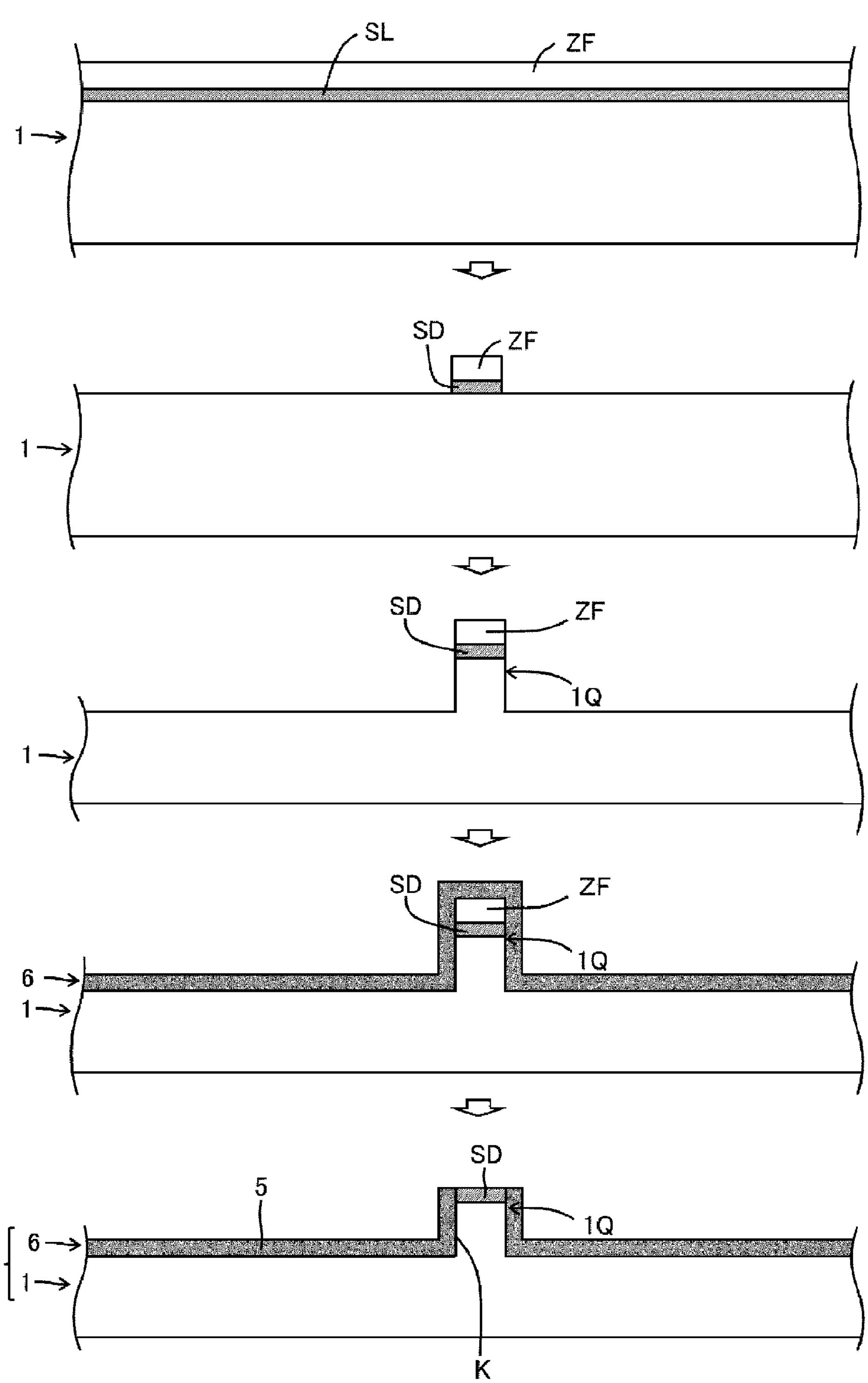
FIG. 17 is a cross-sectional view illustrating the manufacturing method in FIG. 16.

FIG. 16 is a flowchart showing a manufacturing method for manufacturing a template substrate according to Example 1. FIG. 17 is a cross-sectional view illustrating the manufacturing method in FIG. 16. In FIGS. 16 and 17, a step of forming a seed layer SL and a sacrificial film ZF (photoresist, for example) in this order on the main substrate 1, a step of patterning the seed layer SL using the patterned sacrificial film ZF as a mask pattern, a step of etching the surface of the main substrate 1 using the sacrificial film ZF as a mask pattern to form the protruding portion 1Q, a step of forming the mask pattern 6 covering the main substrate 1 and the sacrificial film ZF (using a sputtering method or a PECVD method, for example), and a step of removing the photoresist with a remover to form the opening portion K exposing the seed portion SD and the mask portion 5 are performed. In this case, the mask portion 5 covers the end surfaces (side surfaces) of the seed portion SD.

Figure 18:
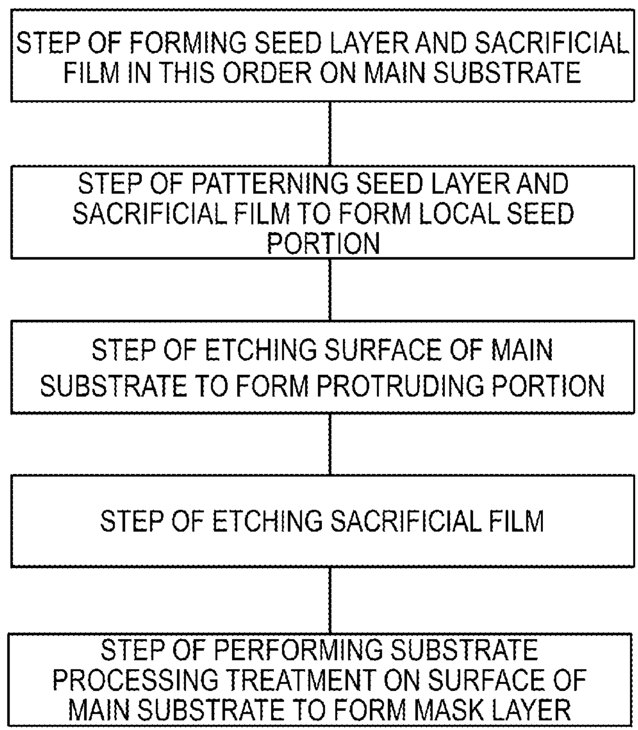
FIG. 18 is a flowchart showing another manufacturing method for manufacturing the template substrate according to Example 1.
Figure 19:
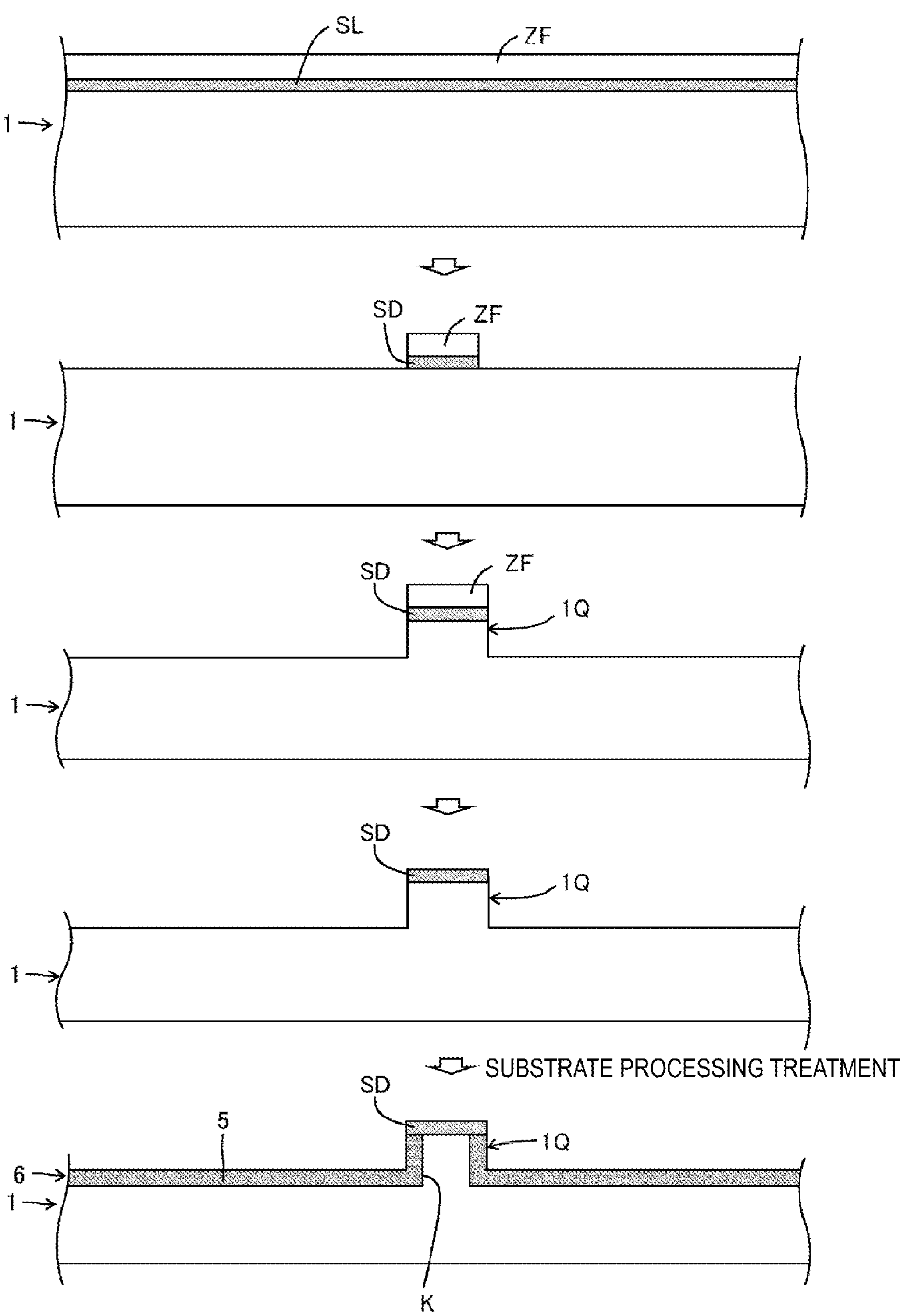
FIG. 19 is a cross-sectional view illustrating the manufacturing method in FIG. 18.

FIG. 18 is a flowchart showing another manufacturing method for manufacturing the template substrate according to Example 1. FIG. 19 is a cross-sectional view illustrating the manufacturing method in FIG. 18. In FIGS. 18 and 19, a step of forming the seed layer SL and the sacrificial film ZF (a silicon oxide film or a resist film) in this order on the main substrate 1, which is a silicon substrate or a silicon carbide substrate, a step of patterning the seed layer SL and the sacrificial film ZF, a step of etching the surface of the main substrate 1 using the sacrificial film ZF as a mask pattern to form the protruding portion 1Q, a step of etching (removing) the sacrificial film ZF, and a step of performing a substrate processing treatment (thermal oxidation treatment or nitriding treatment) on the surface of the main substrate 1 to form the mask portion 5, which is a substrate processing film (a silicon thermal oxide film, a silicon nitride film, or a silicon oxynitride film), and the opening portion K are performed. The substrate processing film has an excellent film quality and is suitable as a selective growth mask that is exposed to a high temperature.

The thickness of the mask pattern 6 is set to approximately 100 nm to approximately 4 μm (preferably approximately 150 nm to approximately 2 μm), and the width of the opening portion K is set to approximately 0.1 μm to 20 μm, for example. The smaller the width of the opening portion K, the smaller the number of threading dislocations propagating from each of the opening portions K to the ELO semiconductor part 8. In addition, the area of the body portion (H1 or the like), which is the low dislocation portion, can be increased.

Film Formation of ELO Semiconductor Part

In Example 1, a GaN layer was used for the ELO semiconductor parts (including 8F, 8S, and 8T), and an ELO film was formed on the above-described template substrate 7 using a metal organic chemical vapor deposition (MOCVD) apparatus. The following may be adopted as examples of the ELO film formation conditions, such as substrate temperature of 1120° C., growth pressure of 50 kPa, 22 sccm of trimethylgallium (TMG), 15 slm of $NH_3$, and V/III=6000 (ratio of group V raw material supply amount to group III raw material supply amount).

In this case, the ELO semiconductor parts were selectively grown on the seed portion SD, and subsequently were laterally grown above (in midair above) the mask portion 5. Then, the lateral growth was stopped before the ELO semiconductor parts laterally grown from both sides of the mask portion 5 met each other.

A method for increasing the lateral film formation rate is as follows. First, a longitudinal growth layer that grows in the Z direction (c-axis direction) is formed on the seed portion SD, and then a lateral growth layer that grows in the X direction (a-axis direction) is formed. For the longitudinal growth, the growth temperature is set as low as 1050° C., for example. In this case, by setting the thickness of the longitudinal growth layer to 10 μm or less, preferably 5 μm or less, and more preferably 3 μm or less, the thickness of the lateral growth layer may be suppressed to be thin and the lateral film formation rate may be increased.

A film-forming temperature of the ELO semiconductor part 8 is preferably 1150° C. or less, rather than a high temperature exceeding 1200° C. The ELO semiconductor part 8 can be formed even at a low temperature below 1000° C., which is more preferable from the viewpoint of suppressing decomposition of the mask portion 5.

Note that in the low-temperature film formation at a temperature below 1000° C., triethylgallium (TEG) is preferably used as a gallium raw material gas. Since an organic raw material is efficiently decomposed at a low temperature with TEG as compared with TMG, the lateral film formation rate can be increased.

For the crystal growth by the ELO method, in addition to the above-described metal organic chemical vapor deposition (MOCVD) method, a hydride vapor phase epitaxy (HVPE) method, a molecular beam epitaxy (MBE) method, or the like can be used.

Functional Layer

The functional layer 9 located on the first and second semiconductor parts 8F and 8S includes a device portion **9*d* as a layer (hereinafter also simply referred to as a device layer), an insulating film 9*p* (passivation film) located in a layer above the device layer 9*p*, and first and second electrodes E1 and E2 located in a layer above the insulating film 9*p*. The body portion H1 and the functional layer 9** may function as a semiconductor device such as a light-emitting diode, a semiconductor laser, or the like.

The device layer **9*d*, the insulating film 9*p*, and the first and second electrodes E1 and E2 do not overlap the tether portion T1. The device layer 9*d* is, for example, a laminate of an n-type semiconductor part (GaN-based, for example), a non-doped semiconductor part (GaN-based, for example), and a p-type semiconductor part (GaN-based, for example). The non-doped semiconductor part may serve as an active layer (a layer in which electrons and holes are combined). The device layer 9*d* may be formed by any chosen method. As the insulating film 9*p*, an inorganic film of silicon oxide, silicon nitride, or the like can be used. One of the first and second electrodes E1 and E2 may be an anode and the other may be a cathode. The area of the first electrode E1 may be greater than the area of the second electrode E2. In Example 1, the first and second electrodes E1 and E2 are provided on the device layer 9*d*, but the configuration is not limited thereto. For example, only the first electrode E1 may be provided on the device layer 9*d***.

Figure 20:
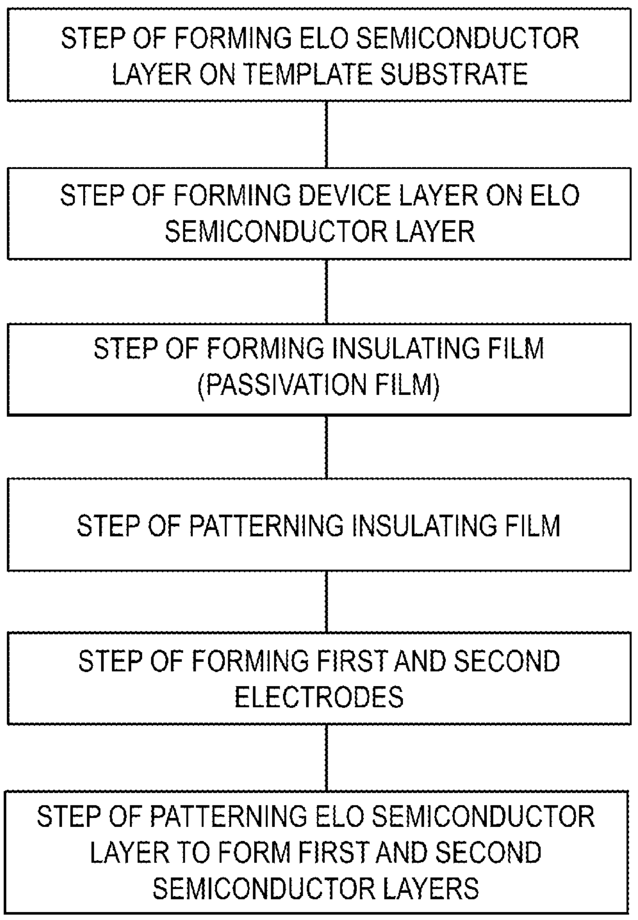
FIG. 20 is a flowchart showing a manufacturing method for manufacturing the semiconductor substrate according to Example 1.
Figure 21:
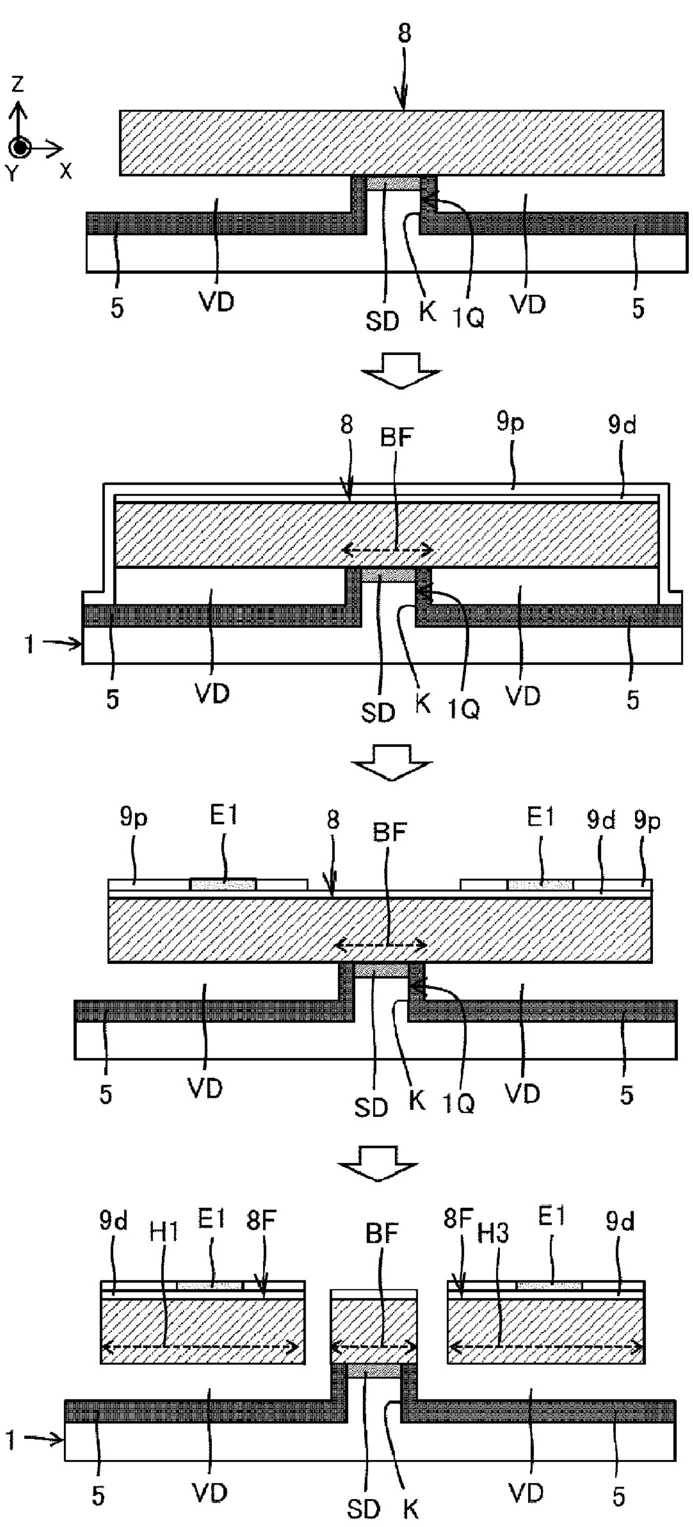
FIG. 21 is a schematic cross-sectional view illustrating the manufacturing method in FIG. 20.

FIG. 20 is a flowchart showing a manufacturing method for manufacturing the semiconductor substrate according to Example 1. FIG. 21 is a cross-sectional view illustrating the manufacturing method in FIG. 20. As illustrated in FIGS. 9, 20, and 21, a step of forming the ELO semiconductor part 8 on the template substrate 7, a step of forming the device layer **9*d* on the ELO semiconductor part 8, a step of forming the insulating film 9*p* on the device layer 9*d*, for example, by the PECVD method, a step of patterning the insulating film 9*p*, a step of forming the first and second electrodes E1 and E2, and a step of performing dry etching (reactive ion etching (RIE), for example) on the ELO semiconductor part 8 to form the first semiconductor part 8F including the body portions H1 and H3 and the tether portions T1 and T3, and the second semiconductor part 8S are performed. The ELO semiconductor part 8** may be etched by electron cyclotron resonance (ECR) etching or chemically assisted ion beam (CAIB) etching, each of which is a dry method, photo-electrochemical (PEC) etching, which is a wet method.

The insulating film **9*p* is a passivation film (a silicon oxide film or a silicon nitride film, for example) formed in a layer above the device layer 9*d*, overlaps the body portion H1 in a plan view, and does not overlap the tether portion T1 in a plan view. In this way, a problem can be avoided in which the insulating film 9*p* may inhibit the breakage of the tether portion T1. As illustrated in FIG. 13, a portion of the insulating film 9*p* (a portion covering a center portion of the end surface of the body portion H1 and reaching the mask portion 5 on the main substrate) functions as the anchor film 9*a*. In this way, the body portion H1 is stabilized, and when the tether portion T1 is broken, the anchor film 9*a*** can also be broken at the same time.

Note that when the ELO semiconductor parts 8 are formed, the ELO semiconductor parts laterally grown from both sides of the mask portion 5 may be caused to meet each other above the mask portion 5, and when the ELO semiconductor parts 8 are etched, a meeting portion (high dislocation portion) may be removed.

Figure 22:
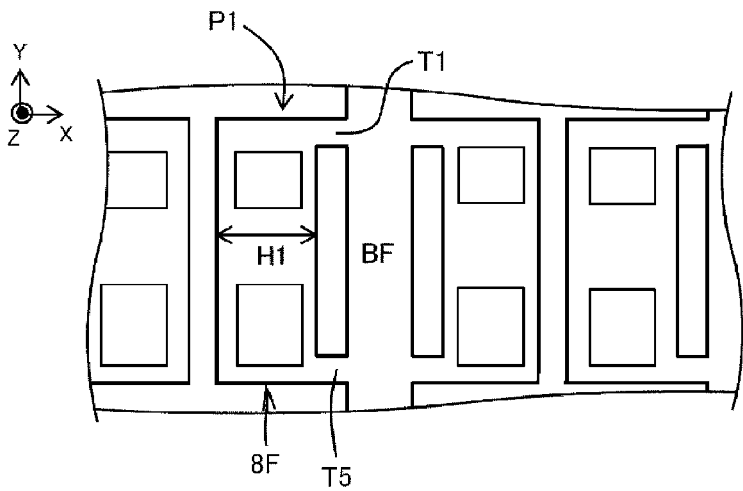
FIG. 22 is a plan view illustrating another configuration of the semiconductor substrate according to Example 1.

FIG. 22 is a plan view illustrating another configuration of the semiconductor substrate according to Example 1. As illustrated in FIG. 22, the first floating portion PI may include the plurality of tether portions T1 and T5, and the body portion H1 may be connected to the first base portion BF via the plurality of tether portions T1 and T5. By providing the plurality of tether portions T1 and T5, there is an advantage in that the body portion H1 is stabilized.

Figure 23:
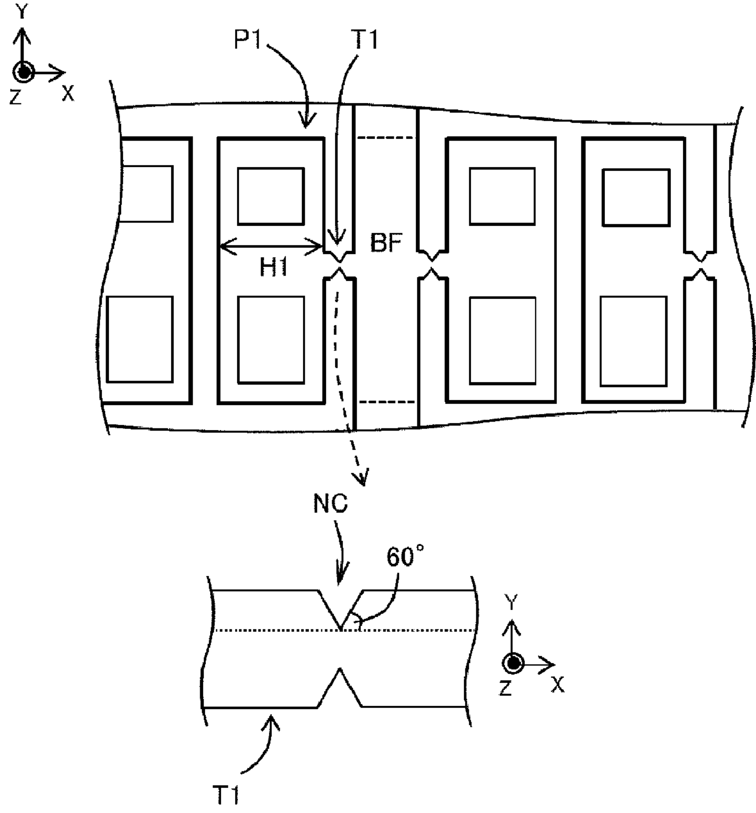
FIG. 23 is a plan view illustrating another configuration of the semiconductor substrate according to Example 1.

FIG. 23 is a plan view illustrating another configuration of the semiconductor substrate according to Example 1. As illustrated in FIG. 23, the tether portion T1 of the first floating portion P1 may be provided with a notch NC. In this case, a configuration is employed in which the side surface of the notch NC forms an angle of 60° with respect to the X direction. The notch NC as described above can be formed, for example, by providing a semicircular notch upon forming the tether portion, and then performing immersion in tetramethylammonium hydroxide (TMAH) to expose the m-plane of the GaN-based semiconductor. By forming an acute breaking starting point such as the notch NC, the tether portion T1 can be easily broken.

Figure 24:
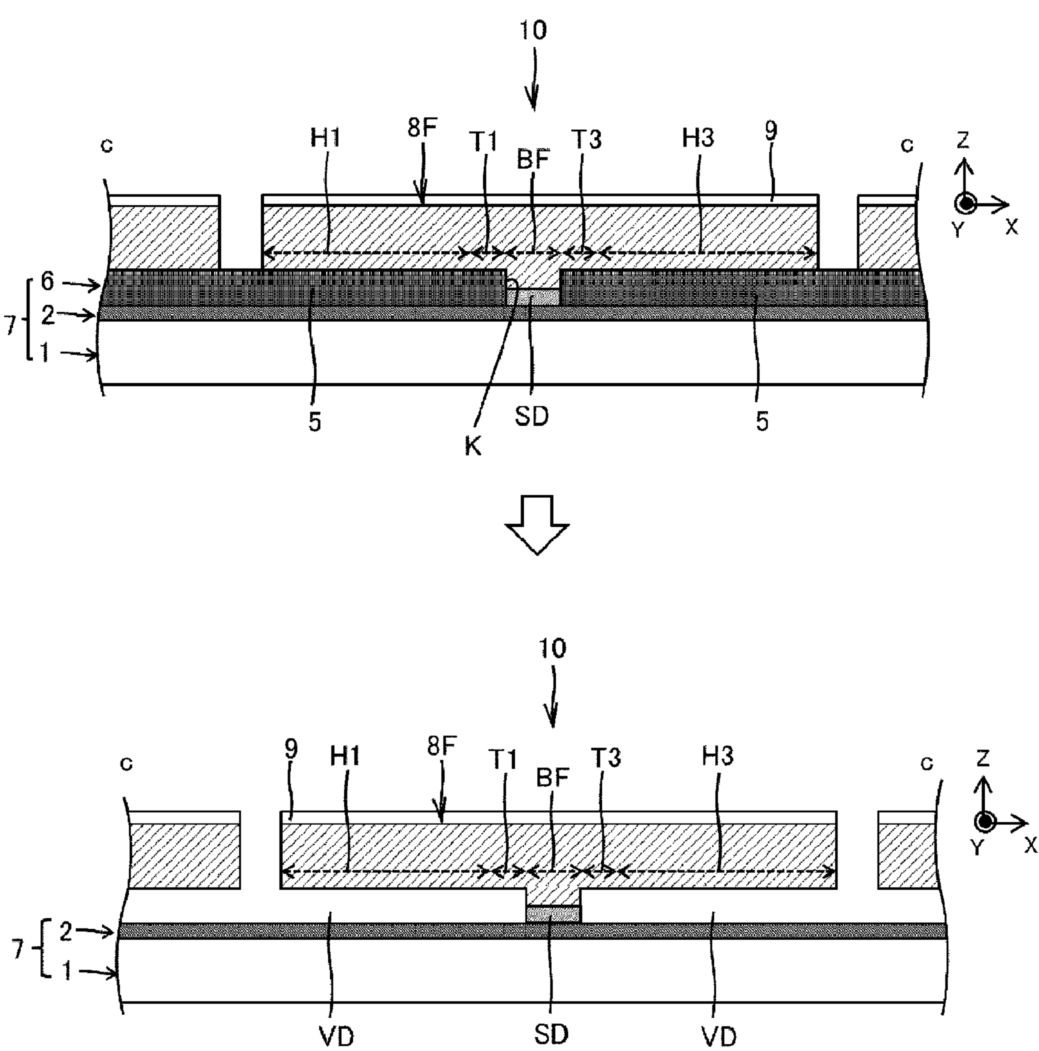
FIG. 24 is a cross-sectional view illustrating another manufacturing method for manufacturing the semiconductor substrate according to Example 1.

FIG. 24 is a cross-sectional view illustrating another manufacturing method for manufacturing the semiconductor substrate according to Example 1. Although the main substrate 1 is provided with the protruding portion 1Q in FIG. 10, the configuration is not limited to this example. As illustrated in FIG. 24, the template substrate 7, which includes the main substrate 1 (silicon substrate, for example), a planar buffer layer 2 (AlN, for example), and the local seed portion SD (GaN-based semiconductor, for example) having the Y direction as the longitudinal direction thereof, in this order, and in which the seed portion SD is exposed at the opening portion K of the mask pattern 6, may be used to form the ELO semiconductor parts (including the first semiconductor part 8F) that are in contact with the seed portion SD and the mask portion 5, and after that, the mask portion 5 may be removed by etching (wet etching, for example). In this way, the first semiconductor part 8F can be caused to float (the lower surface thereof can be caused to be exposed to the hollow portion VD). Note that the mask portion 5 may be removed before the functional layer 9 is formed.

EXAMPLE 2

Figure 25:
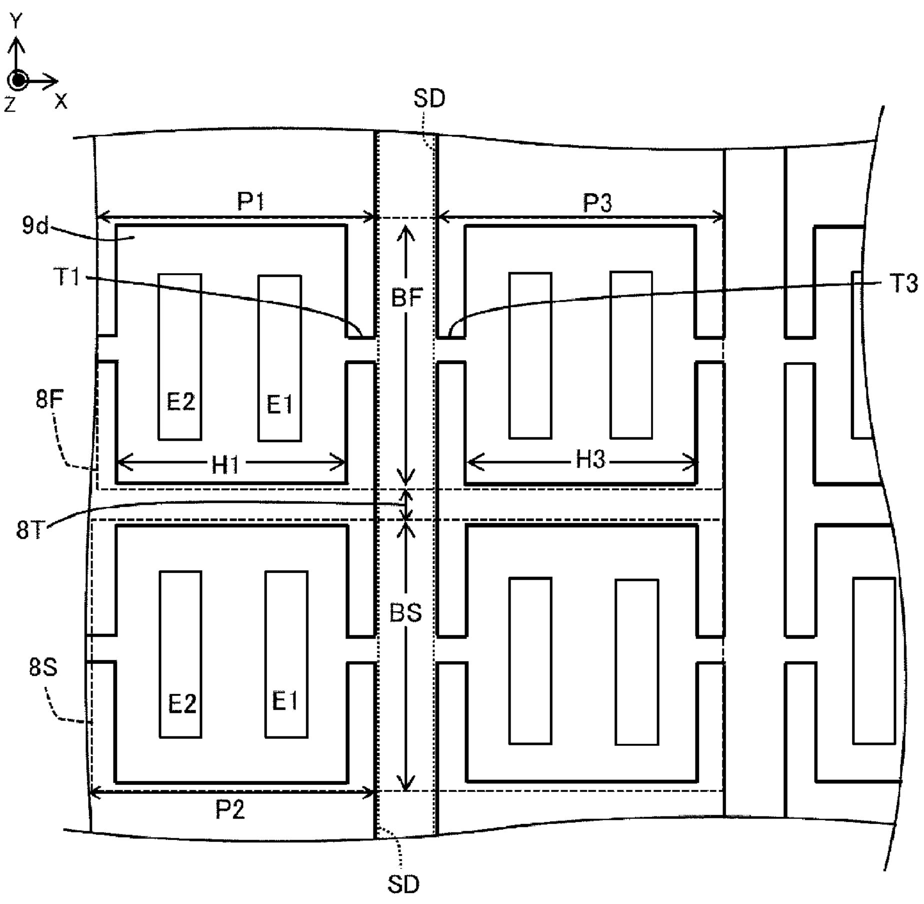
FIG. 25 is a plan view illustrating a configuration of a semiconductor substrate according to Example 2.
Figure 26:
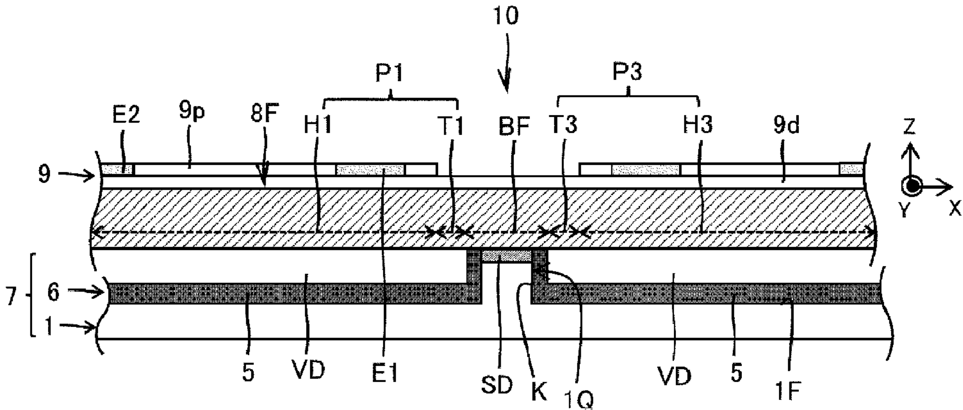
FIG. 26 is a cross-sectional view illustrating the configuration of the semiconductor substrate according to Example 2.
Figure 27:
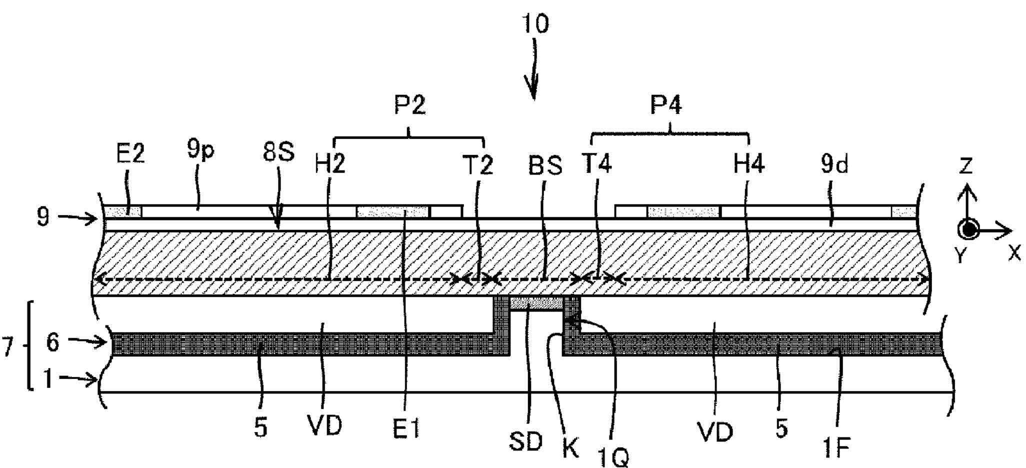
FIG. 27 is a cross-sectional view illustrating the configuration of the semiconductor substrate according to Example 2.

FIG. 25 is a plan view illustrating a configuration of a semiconductor substrate according to Example 2. FIGS. 26 and 27 are cross-sectional views each illustrating a configuration of the semiconductor substrate according to Example 2. In Example 1, the lateral growth is stopped before the ELO semiconductor parts laterally grown from both sides of the mask portion 5 meet each other above the mask portion 5, and the first and second semiconductor parts 8F and 8S include the end surfaces (edges) overlapping the mask portion 5 in a plan view. However, the configuration is not limited to this example. As illustrated in FIGS. 25 to 27, a configuration may be employed in which the ELO semiconductor parts laterally grown from both sides of the mask portion 5 are caused to meet each other above the mask portion 5.

As illustrated in FIGS. 25 to 27, the first semiconductor part 8F includes the first floating portion P1 facing the main substrate 1 via the hollow portion VD, the second semiconductor part 8S includes the second floating portion P2 facing the main substrate 1 via the hollow portion VD, and the first floating portion PI and the second floating portion P2 are separated from each other. The first semiconductor part 8F includes the third floating portion P3 paired with the first floating portion P1, and the first floating portion P1 and the third floating portion P3 are arranged side by side in the X direction in a floating state. The first semiconductor part 8F includes the first base portion BF located on the seed portion SD, and the first base portion BF is located between the first and third floating portions P1 and P3 and connected to the first and third floating portions P1 and P3. The first floating portion P1 includes the tether portion T1 connected to the first base portion BF and the body portion H1 connected to the tether portion T1, and the tether portion T1 has a shorter length in the Y direction than the body portion H1.

The semiconductor substrate 10 includes the mask pattern 6 including the opening portion K and the mask portion 5 (selective growth mask) above the main substrate 1, and the opening portion K and the seed portion SD overlap each other in a plan view. The hollow portion VD is located between the first semiconductor part 8F and the mask portion 5. The mask portion 5 covers the end surfaces of the seed portion SD. That is, the upper surface of the seed portion SD is in contact with the first base portion BF, the lower surface of the seed portion SD is in contact with the upper surface (protruding portion 1Q) of the main substrate 1, and the end surfaces (side surfaces) of the seed portion SD are covered with the mask portion 5. Thus, the semiconductor part 8F is not in contact with the end surface of the seed portion SD.

The functional layer 9 formed on the semiconductor part 8 includes the device layer 9*d*, the insulating film 9*p* (passivation film) located in a layer above the device layer 9*d*, and the first and second electrodes El and E2 located in a layer above the insulating film 9*p.*

EXAMPLE 3

In Examples 1 and 2, the GaN layer was used for the ELO semiconductor parts, but the configuration is not limited to this example. In Example 3, an InGaN layer, which is a GaN-based semiconductor part, may be formed as the first and second semiconductor parts 8F and 8B (ELO semiconductor parts). The lateral film formation of the InGaN layer is performed at a low temperature below 1000° C., for example. This is because the vapor pressure of indium increases at a high temperature and indium is not effectively taken into the film. When the film formation temperature is low, an effect is exhibited in which the interaction between the mask portion 5 and the InGaN layer is reduced. The InGaN layer has an effect of exhibiting lower reactivity with the mask portion 5 than the GaN layer. When indium is taken into the InGaN layer at an In composition level of 1% or more, the reactivity with the mask portion 5 is further lowered, which is desirable. As the gallium raw material gas, triethylgallium (TEG) is preferably used.

EXAMPLE 4

Figure 28:
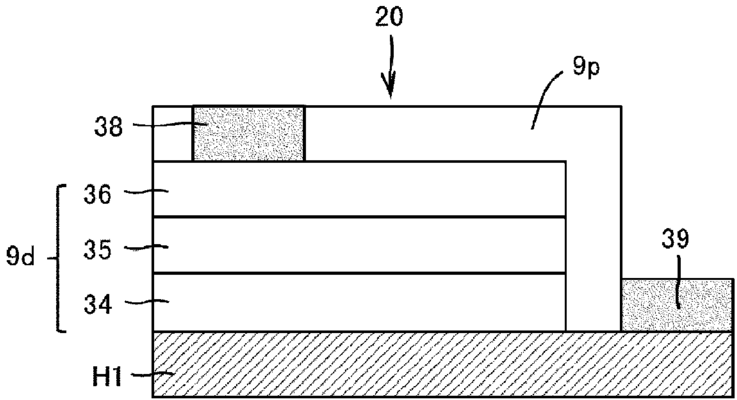
FIG. 28 is a schematic cross-sectional view illustrating a configuration of Example 4.

FIG. 28 is a schematic cross-sectional view illustrating a configuration of Example 4. In Example 4, the body portion H1 and the device layer 9*d* constitute the semiconductor device 20 that functions as an LED (light-emitting diode). The body portion H1 (GaN-based semiconductor, for example) is an n-type doped with, for example, silicon or the like. The device layer 9*d* includes an active layer 34, an electron blocking layer 35, and a GaN-based p-type semiconductor part 36 in this order from the bottom layer side. The active layer 34 is a multi-quantum well (MQW), and includes an InGaN layer and a GaN layer. The electron blocking layer 35 is, for example, an AlGaN layer. The GaN-based p-type semiconductor part 36 is, for example, a GaN layer. An anode 38 (first electrode E1, for example) is disposed in contact with the GaN-based p-type semiconductor part 36, and a cathode 39 (second electrode E2, for example) is disposed in contact with the body portion H1.

Figure 29:
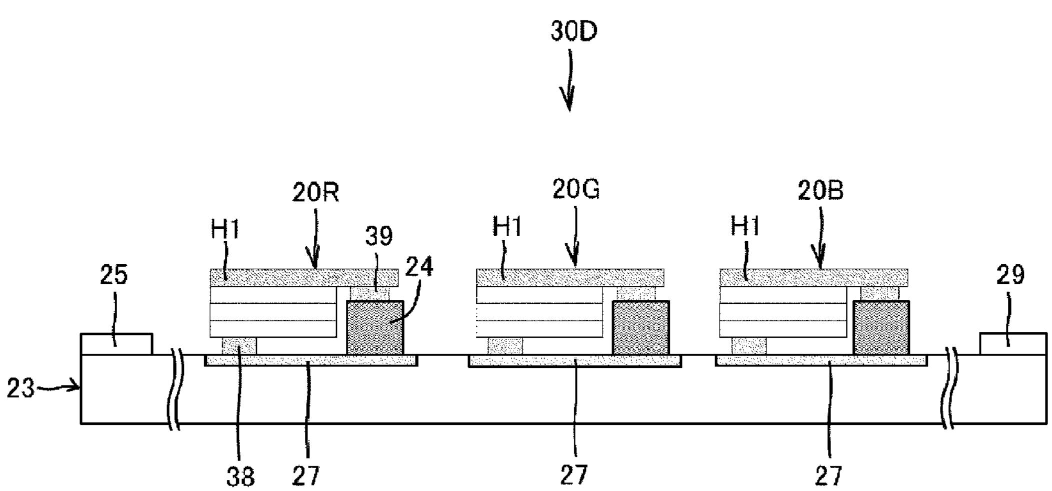
FIG. 29 is a cross-sectional view illustrating an application example of Example 4 to an electronic device.

FIG. 29 is a cross-sectional view illustrating an application example of Example 4 to an electronic device. According to Example 4, a red micro LED 20R, a green micro LED 20G, and a blue micro LED 20B may be obtained, and a micro LED display 30D (electronic device) may be constituted by mounting these LEDs on the drive substrate (TFT substrate) 23. As an example, each of the red micro LED 20R, the green micro LED 20G, and the blue micro LED 20B is mounted on a respective one of a plurality of pixel circuits 27 of the drive substrate 23 via a conductive resin 24 (for example, an anisotropic conductive resin) or the like, and then a control circuit 25, a driver circuit 29, and the like are mounted on the drive substrate 23. The drive substrate 23 may include a part of the driver circuit 29.

EXAMPLE 5

Figure 30:
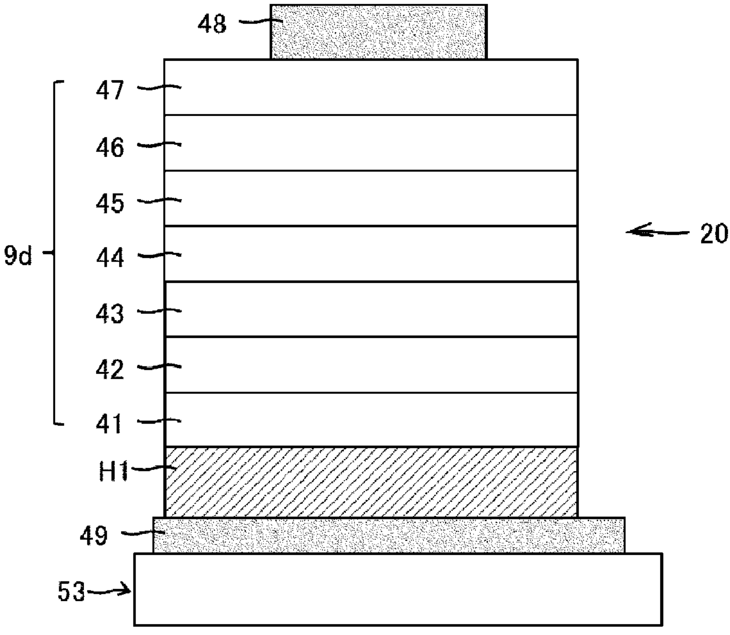
FIG. 30 is a schematic cross-sectional view illustrating a configuration of Example 5.

FIG. 30 is a schematic cross-sectional view illustrating a configuration of Example 5. In Example 5, the body portion H1 and the device layer 9*d* constitute the semiconductor device 20 that functions as a semiconductor laser. The device layer 9*d* includes an n-type cladding layer 41, an n-type light guide layer 42, an active layer 43, an electron blocking layer 44, a p-type light guide layer 45, a p-type cladding layer 46, and a GaN-based p-type semiconductor part 47 in this order from the bottom layer side. For each of the light guide layers 42 and 45, an InGaN layer may be used. A GaN layer or AlGaN layer may be used for each of the cladding layers 41 and 46. An anode 48 is disposed in contact with the GaN-based p-type semiconductor part 47, and the body portion H1 is mounted on a pad 49 of a mounting substrate 53.

EXAMPLE 6

Figure 31:
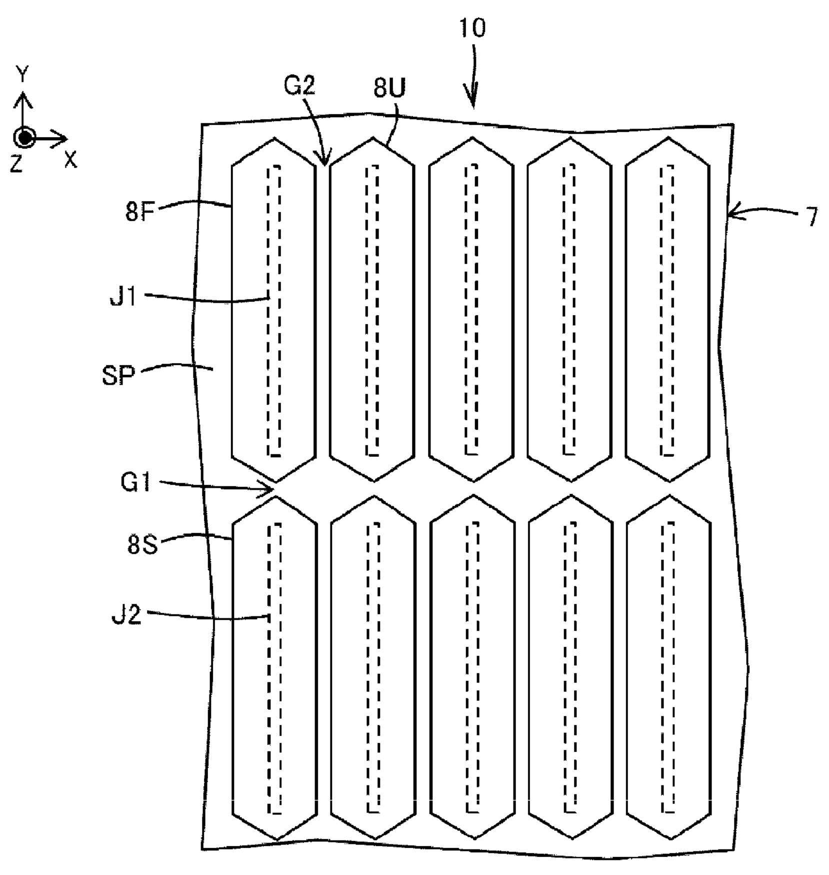
FIG. 31 is a plan view illustrating a semiconductor substrate according to Example 6.
Figure 32:
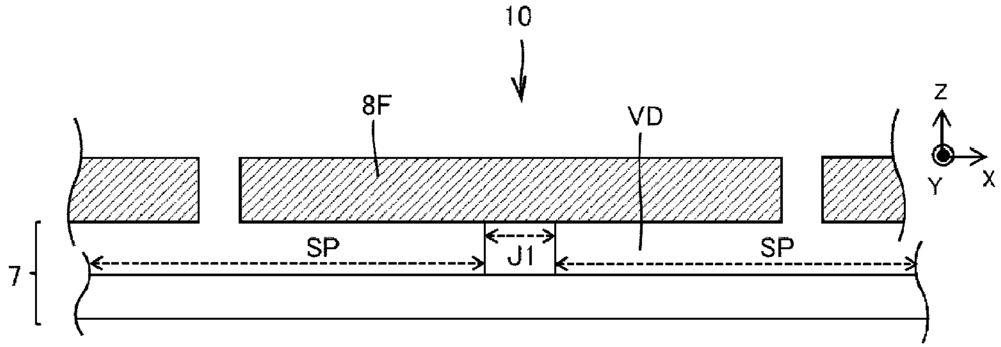
FIG. 32 is a cross section illustrating the semiconductor substrate according to Example 6.

FIG. 31 is a plan view illustrating a semiconductor substrate according to Example 6. FIG. 32 is a cross section illustrating the semiconductor substrate according to Example 6. The semiconductor substrate 10 according to Example 6 includes the template substrate 7 including first and second seed regions J1 and J2 and a growth suppression region (deposition suppression region) SP on the upper surface thereof, the first semiconductor part 8F extending from the first seed region J1 to above the growth suppression region SP and forming the hollow portion VD between itself and the growth suppression region SP, and the second semiconductor part 8S extending from the second seed region J2 to above the growth suppression region SP and forming the hollow portion VD between itself and the growth suppression region SP. The first and second semiconductor parts 8F and 8S are adjacent to each other in the first direction (Y direction) with a gap G1 interposed therebetween. The Y direction may be the m-axis direction of the first and second semiconductor parts 8F and 8S each containing a nitride semiconductor. The first and second seed regions J1 and J2 may be located above the growth suppression region SP.

The first and second seed regions J1 and J2 may each have a shape having the Y direction as the longitudinal direction. Both ends of each of the first and second semiconductor parts 8F and 8S may be tapered in the Y axis direction. A fourth semiconductor part 8U adjacent to the first semiconductor part 8F in the X direction may be disposed with a gap G2 interposed therebetween. The X direction may be the a-axis direction of the first and second semiconductor parts 8F and 8U each containing a nitride semiconductor. The semiconductor substrate 10 has an advantage of not easily becoming warped. The first and second seed regions J1 and J2 may each be a region, of the upper surface of the seed portion, overlapping the opening portion of the mask pattern, and the growth suppression region SP may be the upper surface of the mask portion.

REFERENCE SIGNS

1 Main substrate
SD Seed portion
5 Mask portion
6 Mask pattern
7 Template substrate
8F First semiconductor part
8S Second semiconductor part
9 Functional layer
9*d* Device layer
10 Semiconductor substrate
20 Semiconductor device
30 Electronic device
70 Manufacturing apparatus for manufacturing semiconductor substrate
K Opening portion
VD Hollow portion
P1 First floating portion
P2 Second floating portion
P3 Third floating portion
H1 Body portion
T1 Tether portion

The invention claimed is:

1. A semiconductor substrate comprising:
a template substrate comprising a first region, a second region, and a third region that are aligned in a second direction in a plan view; and
a first semiconductor part comprising (i) a first base portion which is elongated upward from the second region and (ii) a first floating portion which is elongated from the first base portion to above the first region and is not in contact with the first region: wherein:
a longitudinal direction of the second region is a first direction,
the first floating portion comprising a first body portion and a first tether portion which connects the first body portion and the first base portion, and
the first tether portion has a length in the first direction shorter than a length of the first body portion in the first direction.

2. The semiconductor substrate according to claim 1, further comprising:
a second semiconductor part comprising: (i) a second base portion which is elongated upward from the second region, and (ii) a second floating portion which is elongated from the second base portion to above the first region and is not in contact with the first region, wherein
the first semiconductor part and the second semiconductor part are arranged side by side in the first direction, and
the first floating portion and the second floating portion are separated from each other.

3. The semiconductor substrate according to claim 1, wherein:
the first semiconductor part comprises a third floating portion which is elongated from the first base portion to above the third region and is not in contact with the third region, and
the first floating portion and the third floating portion are arranged side by side in the second direction.

4. The semiconductor substrate according to claim 1, wherein:
the first semiconductor part contains a GaN-based semiconductor, and
the second direction is an <11-20> direction of the GaN-based semiconductor.

5. The semiconductor substrate according to claim 1, wherein:
the first semiconductor part contains a GaN-based semiconductor, and
the first direction is an <1-100> direction of the GaN-based semiconductor.

6. The semiconductor substrate according to claim 1, further comprising:
a functional portion overlapping the first floating portion in a plan view.

7. The semiconductor substrate according to claim 1, wherein:
the length of the first tether portion in the first direction is equal to or less than half the length of the first body portion in the first direction.

8. The semiconductor substrate according to claim 1, wherein:

a notch is provided in the first tether portion.

9. The semiconductor substrate according to claim 1, wherein:

the first floating portion comprises a plurality of the first tether portions, each connected to the first base portion.

10. The semiconductor substrate according to claim 2, wherein:

the second floating portion comprises a second body portion and a second tether portion which connects the second body portion and the second base portion, and the second tether portion has a length in the first direction shorter than a length of the second body portion in the first direction.

11. The semiconductor substrate according to claim 3, wherein:

the third floating portion comprises a third body portion and a third tether portion which connects a second body portion and the first base portion, and the third tether portion has a length in the first direction shorter than a length of the third body portion in the first direction.

12. The semiconductor substrate according to claim 1, wherein:

the template substrate comprises a main substrate and a buffer layer which is located on the main substrate, the first semiconductor part contains a GaN-based semiconductor, and the main substrate is a heterogeneous substrate having a lattice constant different from a lattice constant of the GaN-based semiconductor.

13. The semiconductor substrate according to claim 1, wherein:

the first floating portions comprises a low defect region having a threading dislocation density equal to or less than $5\times10^6$ [pieces/$cm^2$], and a size of the low defect region in the second direction is equal to or greater than 10 μm.

14. The semiconductor substrate according to claim 6, wherein the functional portion comprises:

an electrode; and an active section.

15. The semiconductor substrate according to claim 6, wherein:

the functional portion comprises:

a device portion; and an insulating film located higher than the device portion, and the insulating film overlaps the first body portion and does not overlap the first tether portion in a plan view.

16. The semiconductor substrate according to claim 15, wherein:

a portion of the insulating film is in contact with a side surface of the first body portion and functions as an anchor film fixing the first body portion to the template substrate.

17. A manufacturing method for manufacturing the semiconductor substrate according to claim 1, the manufacturing method comprising:

forming the first semiconductor part from a semiconductor part formed by an ELO method.

18. A manufacturing method for manufacturing a semiconductor device from a semiconductor substrate, the semiconductor substrate comprising:

a template substrate comprising a first region, a second region, and a third region that are aligned in a second direction in a plan view; and a first semiconductor part comprising: (i) a first base portion which is elongated upward from the second region and (ii) a first floating portion which is elongated from the first base portion to above the first region and is not in contact with the first region, and wherein:

a longitudinal direction of the second region is a first direction, the manufacturing method comprising:

forming a first body portion and a first tether portion which connects the first body portion and the first base portion by patterning the first floating portion, and wherein:

the first tether portion has a length in the first direction shorter than a length of the first body portion in the first direction.

19. The manufacturing method according to claim 18, further comprising breaking the first tether portion.

20. The manufacturing method according to claim 19, further comprising forming a functional portion on the first floating portion before the breaking.

* * * * *